US011329227B2

(12) United States Patent
Kasmai et al.

(10) Patent No.: US 11,329,227 B2
(45) Date of Patent: *May 10, 2022

(54) PAINT CIRCUITS

(71) Applicant: Google LLC, Mountain View, CA (US)

(72) Inventors: Katy Kasmai, New York, NY (US); Haydn Kirk Vestal, Brooklyn, NY (US)

(73) Assignee: Google LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/604,776

(22) PCT Filed: Sep. 6, 2018

(86) PCT No.: PCT/US2018/049663
§ 371 (c)(1),
(2) Date: Oct. 11, 2019

(87) PCT Pub. No.: WO2019/055270
PCT Pub. Date: Mar. 21, 2019

(65) Prior Publication Data
US 2021/0119063 A1  Apr. 22, 2021

Related U.S. Application Data

(60) Provisional application No. 62/558,579, filed on Sep. 14, 2017.

(51) Int. Cl.
*H01L 51/00* (2006.01)
*H01G 9/20* (2006.01)
(Continued)

(52) U.S. Cl.
CPC ............ *H01L 51/0007* (2013.01); *C09D 5/22* (2013.01); *C09D 5/24* (2013.01); *C09D 5/32* (2013.01);
(Continued)

(58) Field of Classification Search
CPC . H01L 51/0007; H01L 27/283; H01L 27/288; H01L 27/301; H01L 27/3225;
(Continued)

(56) References Cited

U.S. PATENT DOCUMENTS 6,013,871 A   1/2000  Curtin
6,077,722 A   6/2000  Jansen
(Continued)

FOREIGN PATENT DOCUMENTS

CN      105594006      5/2016
WO   WO 2014181072   11/2014

OTHER PUBLICATIONS

IN Office Action in Indian Application No. 201927042149, dated Dec. 23, 2020, 17 pages.
(Continued)

*Primary Examiner* — Erik Kielin
(74) *Attorney, Agent, or Firm* — Fish & Richardson P.C.

(57) ABSTRACT

Methods and devices for forming painted circuits using multiple layers of electrically conductive paint. In one aspect, a painted circuit includes a substrate (111) and one or more paint layer (106, 108, 110, 112, 114, 116, 120, 122) applied to the substrate, where the one or more paint layers each form an electrical component of the painted circuit. A given paint layer of the one or more paint layers includes a conductive paint formulation having a resistance that is defined by a concentration of conductive material that is included in the conductive paint formulation and a thickness of the given paint layer, and lower concentrations of the conductive material included in the conductive paint formulation provide a higher resistance than higher concentrations of conductive material.

20 Claims, 12 Drawing Sheets

(51) Int. Cl.

| | |
|---|---|
| H01G 9/00 | (2006.01) |
| H01L 27/28 | (2006.01) |
| H01L 27/30 | (2006.01) |
| H01L 31/053 | (2014.01) |
| H01L 31/02 | (2006.01) |
| H01L 31/12 | (2006.01) |
| F21K 9/64 | (2016.01) |
| F21S 9/03 | (2006.01) |
| H01L 27/32 | (2006.01) |
| H01L 49/02 | (2006.01) |
| C09D 7/65 | (2018.01) |
| C09D 7/61 | (2018.01) |
| C09D 5/22 | (2006.01) |
| C09D 5/24 | (2006.01) |
| C09D 5/32 | (2006.01) |
| C09D 133/26 | (2006.01) |
| C09D 157/06 | (2006.01) |
| C09D 201/00 | (2006.01) |
| H01L 51/42 | (2006.01) |
| H01L 51/44 | (2006.01) |
| H01L 51/50 | (2006.01) |
| H01M 10/46 | (2006.01) |
| C08K 3/16 | (2006.01) |
| C08K 3/22 | (2006.01) |
| H01L 51/05 | (2006.01) |

(52) U.S. Cl.
CPC ............ *C09D 7/61* (2018.01); *C09D 7/65* (2018.01); *C09D 133/26* (2013.01); *C09D 157/06* (2013.01); *C09D 201/00* (2013.01); *F21K 9/64* (2016.08); *F21S 9/037* (2013.01); *H01G 9/0029* (2013.01); *H01G 9/0036* (2013.01); *H01G 9/204* (2013.01); *H01G 9/2013* (2013.01); *H01G 9/2022* (2013.01); *H01G 9/2031* (2013.01); *H01G 9/2059* (2013.01); *H01G 9/2068* (2013.01); *H01L 27/283* (2013.01); *H01L 27/288* (2013.01); *H01L 27/301* (2013.01); *H01L 27/3225* (2013.01); *H01L 28/20* (2013.01); *H01L 31/02021* (2013.01); *H01L 31/053* (2014.12); *H01L 31/125* (2013.01); *H01L 51/004* (2013.01); *H01L 51/0004* (2013.01); *H01L 51/0026* (2013.01); *H01L 51/0037* (2013.01); *H01L 51/4253* (2013.01); *H01L 51/44* (2013.01); *H01L 51/441* (2013.01); *H01L 51/448* (2013.01); *H01L 51/5016* (2013.01); *H01L 51/5032* (2013.01); *H01M 10/465* (2013.01); *C08K 3/16* (2013.01); *C08K 3/22* (2013.01); *C08K 2003/2241* (2013.01); *H01G 9/2095* (2013.01); *H01L 27/3227* (2013.01); *H01L 51/0078* (2013.01); *H01L 51/0575* (2013.01); *H03K 2217/96019* (2013.01)

(58) Field of Classification Search
CPC ... H01L 28/20; H01L 51/004; H01L 51/0037; H01L 51/4253; H01L 51/441; C09D 5/22; F21S 9/037; H01G 9/0029; H01G 9/2013; H01G 9/2022; H01G 9/2059
See application file for complete search history.

(56) References Cited

U.S. PATENT DOCUMENTS

| | | | |
|---|---|---|---|
| 10,283,712 B1* | 5/2019 | Kasmai | H01L 27/283 |
| 2002/0157702 A1 | 10/2002 | Cordaro | |
| 2013/0008509 A1 | 1/2013 | Subbiah | |
| 2013/0020113 A1 | 1/2013 | Corbea | |
| 2013/0278989 A1 | 10/2013 | Lam | |
| 2016/0218308 A1 | 7/2016 | Desilvestro | |
| 2019/0080853 A1 | 3/2019 | Kasmai | |

OTHER PUBLICATIONS

'Engineering.mit.edu' [online] "How does a battery work?" Last updated on: Unknown Author: Mary Bates [retrieved on Jul. 17, 2017] Retrieved from Internet: URL<http://engineering.mit.edu/engage/ask-an-engineer/how-does-a-battery-work/> 5 pages.

'pveducation.org' [online] "Bias of PN Junctions," 2017, [retrieved on Jul. 20, 2017] Retrieved from Internet: URL<http://pveducation.org/pvcdrom/bias-of-pn-junctions> 2 pages.

'pveducation.org' [online] "Formation of a PN-Junction," 2017, [retrieved on Jul. 20, 2017] Retrieved from Internet: URL<http://pveducation.org/pvcdrom/formation-of-a-pn-junction> 1 page.

'pveducation.org' [online] "Light Generated Current," 2017, [retrieved on Jul. 20, 2017] Retrieved from Internet: URL<http://pveducation.org/pvcdrom/light-generated-current> 1 page.

'pveducation.org' [online] "Module Circuit Design," 2017, [retrieved on Jul. 20, 2017] Retrieved from Internet: URL<http://pveducation.org/pvcdrom/modules/module-circuit-design> 2 pages.

'pveducation.org' [online] "Solar Cell Structure," 2017, [retrieved on Jul. 20, 2017] Retrieved from Internet: URL<http://pveducation.org/pvcdrom/solar-cell-structure> 1 page.

'wikipedia.org' [online] "Active Matrix," Last updated on May 10, 2017, [retrieved on Jul. 20, 2017] Retrieved from Internet: URL<https://en.wikipedia.org/wiki/Active_matrix> 2 pages.

'wikipedia.org' [online] "Electrochemical gradient," Last updated on Mar. 25, 2017 [retrieved on Jul. 20, 2017] Retrieved from Internet: URL<https://en.wikipedia.org/wiki/Electrochemical_gradient> 6 pages.

'wikipedia.org' [online] "Oxidizing agent," Last updated on May 24, 2017 [retrieved on Jul. 20, 2017] Retrieved from Internet: URL<https://en.wikipedia.org/wiki/Oxidizing_agent> 4 pages.

www.extrememateriels-arkema.com [online] "Lithium Ion Battery," Publication Date: Unknown [Retrieved on Jul. 17, 23017] Retrieved from Internet: URL<http://www.extrememateriels-arkema.com/en/markets-and-applications/renewable-energy/lithium-ion-battery/> 6 pages.

'www.masterorganicchemistry.com' [online] "Polaw Protic? Polar Aprotic? NonPolar? All About Solvents" Author: James, Publication Date: Apr. 27, 2012 [retrieved on Jul. 17, 2017] Retrieved from Internet: URL< http://www.masterorganicchemistry.com/2012/04/27/polar-protic-polar-aprotic-nonpolar-all-about-solvents/> 31 pages.

'www.technologyreview.com' [online] "Q&A: Bill Gates," Jason Pontin, MIT Technology Review, Apr. 25, 2016, [retrieved on Jul. 20, 2017] Retrieved from Internet: URL<https://www.technologyreview.com/s/601242/qa-bill-gates/> 23 pages.

Bari et al. "Study of the effects of UV-exposure on dye-sensitized solar cells," IEEE International Reliability Physics Symposium, Apr. 14-18, 2013, 7 pages.

Bella et al. "Aqueous dye-sensitized solar cells," Chemical Society Reviews, vol. 44(11), Jun. 7, 2015, 44 pages.

Chen et al. "Nano-structured CuO—Cu2O Complex Thin Film for Application in CH3NH3PbI3 Perovskite Solar Cells," Nanoscale Res Lett vol. 11, Dec. 2016, 7 pages.

Godlewski et al. "Adsorption and Self-Assembly of Large Polycyclic Molecules on the Surfaces of TiO2 Single Crystals," International Journal of Molecular Science, 2013(14), Jan. 2013, 21 pages.

Hamadanian et al. "Dependence on Energy Conversion Efficiency of dye-sensitized Solar Cells on the Annealing Temperature of TiO2 Nanoparticles," Materials Science in Semiconductor Processing, vol. 15 (4) Aug. 2012, 10 pages.

Hara et al. "Organic Dyes for Efficient and Stable Dye-Sensitized Solar Cells," Material Matters, 4.4, 2009, 7 pages.

Ho et al. "Discrete Photoelectrodes with dyes having different absorption wavelengths for efficient cobalt-based tandem dye-sensitized solar cells," Scientific Reports, vol. 7, No. 1, May 23, 2017, 10 pages.

(56) References Cited

OTHER PUBLICATIONS

Kang et al. "Brush-painted flexible organic solar cells using highly transparent and flexible Ag nanowire network electrodes," Solar Energy Material and Solar Cells, Elsevier Science Publishers, vol. 122, Dec. 22, 2013, 6 pages.
Kondo et al. "Atomic scale characterization of nitrogen-doped graphite: Effect of the dopant nitrogen on the electronic structure of the surrounding carbon atoms," Physical review B 83(6), Jul. 23, 2012, 37 pages.
Lehtimaki et al. "Performance stability and operation voltage optimization of screen-printed aqueous supercapacitors," Scientific Reports, vol. 7, Apr. 6, 2017, 10 pages.
Meyer et al. "All screen printed dye solar cell," Proceedings of SPIE, vol. 6656, Sep. 13, 2007, 12 pages.
Nelson et al., "Transistor paint: high mobilities in small bandgap polymer semiconductor based on the strong acceptor, diketopyrrolopyrrole and strong donor, dithienopyrrole." Advanced Materials 22.41 (2010): 4617-4621.
Ostfeld et al. "Flexible photovoltaic power systems: integration opportunities, challenges and advances," Flexible and Printed Electronics, 2(1), Mar. 1, 2017, 24 pages.
PCT International Preliminary Report on Patentability in International Appln. No. PCT/US2018/049663, dated Aug. 27, 2019, 8 pages.
PCT International Search Report and Written Opinion issued in International Application No. PCT/US2018/049663, dated Dec. 4, 2018, 16 pages.
PCT International Search Report and Written Opinion issued in International Application No. PCT/US2018/050897, dated Dec. 4, 2018, 16 pages.

Tvarozek et al. "Preparation of Transparent Conductive AZO thin films for Solar Cells," IEEE International Conference on Advanced Semiconductor Devices and Microsystems, Oct. 2008, 25 pages.
Viyuyi, "Resistivity," Electronics Tutorial, dated Jun. 6, 2017, 7 pages.
Wu et al. "Organic sensitizers from D—pi—A to D—A—pi—A: effect of the internal electron-withdrawing units on molecular absorption, energy levels and photovoltaic performances," Chem. Soc. Rev. 2013, 42, 2039, 20 pages.
Wurfel et al. "Charge Carrier Separation in Solar Cells," IEEE Journal of Photovoltaics, 5(1) Jan. 2015, 9 pages.
Xu. "Advanced Organic Hole Transport material for Solution-Processed Photovoltaic Devices," Doctoral Thesis, Universitets-service US AB, Stockhom, Stockholm 2015, 88 pages.
Zhang et al. "All-solution processed transparent organic light emitting diodes," Nanoscale, 7(47), Nov. 2, 2015, 6 pages.
Zhou et al. "Dye-sensitized solar cells using 20 natural dyes as sensitizers," Journal of Photochemistry and Photobiology A: Chemistry 219(2-3) Apr. 15, 2011, 7 pages.
EP Office Action in European Application No. 18779129.8, dated Oct. 23, 2020, 5 pages.
CN Office Action in Chinese Appln. No. 20188003589, dated Jan. 28, 2021, 36 pages (with English translation).
Thelakkat et al., "Fully Vapor-Deposited Thin-Layer Titanium Dioxide Solar Cells", Adv. Mater., 14, No. 8, Apr. 18, 2002, pp. 577-581.
"Wu et al., ""Electrospun Metal Nanofiber Webs as High-Performance Transparent Electrode"", American Chemical Society, Nano Letters, 2010, 10, pp. 4242-4248".
PCT Written Opinion in International Application No. PCT/US2018/050897, dated Aug. 22, 2019, 6 pages.
IN Office Action in Indian Appln. No. 201927041748, dated Jun. 8, 2021, 6 pages.

* cited by examiner

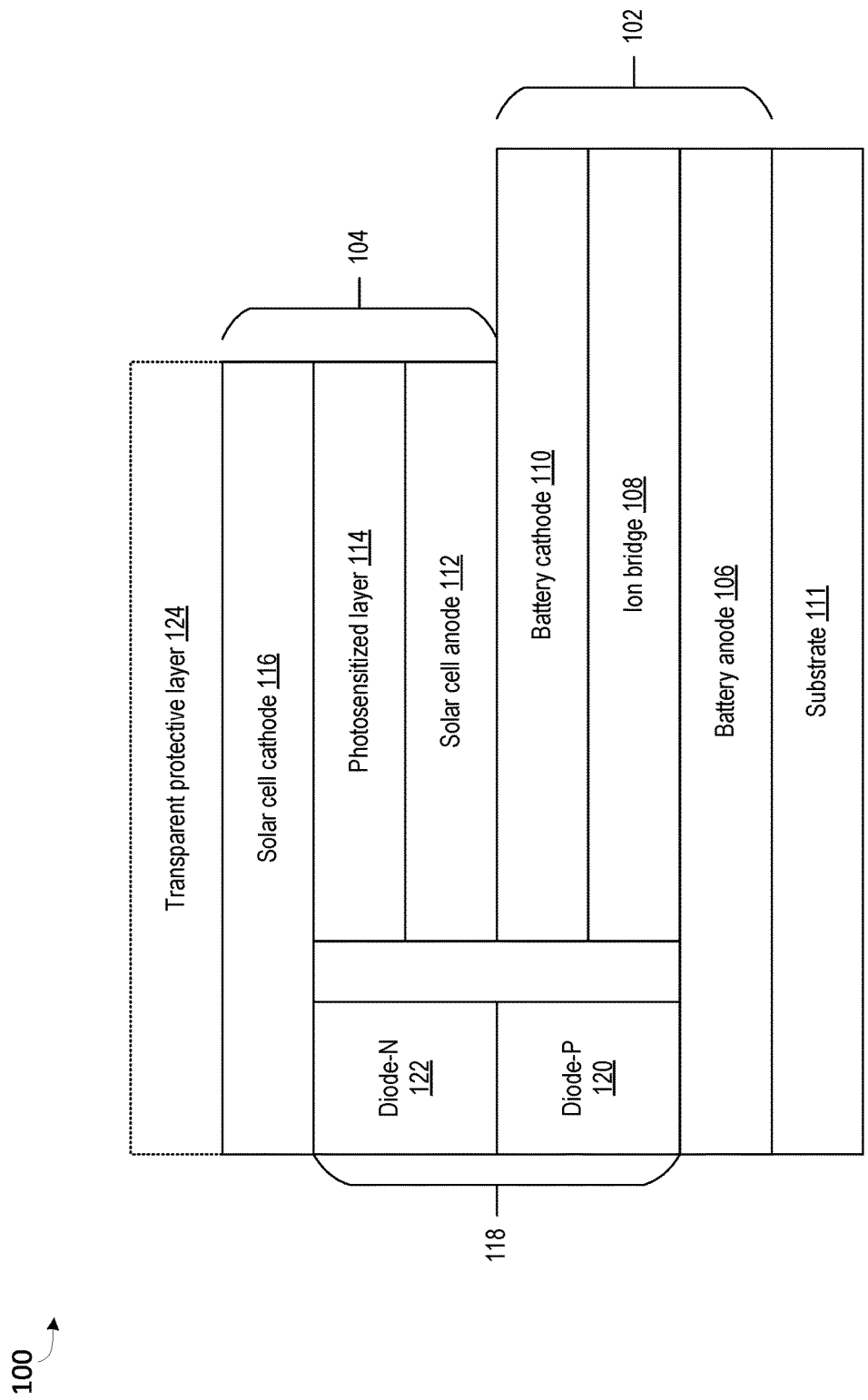

PAINT CIRCUITS

This application is a national stage application under 35 U.S.C. § 371 of PCT International Application No. PCT/US2018/049663, filed Sep. 6, 2018, which claims the benefit of U.S. Provisional Application Ser. No. 62/558,579, filed Sep. 14, 2017. The contents of the foregoing applications are hereby incorporated by reference.

BACKGROUND

Traditional solar cells use substrates with highly regular crystalline structure, for example, crystalline silicon. Newer technologies include thin-film, amorphous solar cells to create discrete layers of individual material with highly regular and predictable chemical structure. Commercial solar cell fabrication, in general, requires highly specialized equipment, which restricts fabricated solar cells to geographic locations with access to the complex manufacturing equipment and/or specialized shipping and installation capabilities.

SUMMARY

This specification relates to paint circuits that can be formed using multiple layers of electrically conductive paint, and can, for example, be used to form solar paint circuit to convert sunlight into electricity.

In general, one innovative aspect of the subject matter described in this specification can be embodied in a painted circuit including a substrate and one or more paint layers applied to the substrate, where the one or more paint layers each form an electrical component of the painted circuit. A first paint layer of the one or more paint layers includes a conductive paint formulation having a resistance that is defined by a concentration of conductive material that is included in the conductive paint formulation and a thickness of the given paint layer, and lower concentrations of the conductive material included in the conductive paint formulation provide a higher resistance than higher concentration of conductive material. Other embodiments of this aspect include corresponding systems, apparatus, and computer programs, configured to perform the actions of the methods, encoded on computer storage devices.

These and other embodiments can each optionally include one or more of the following features. In some implementations, the painted circuit has one or more paint layers of conductive paint including a battery anode paint layer applied to the substrate, an ion bridge paint layer applied to less than all of the battery anode paint layer, a battery cathode paint layer applied to the ion bridge layer, a solar cell anode paint layer applied to less than all of the battery cathode paint layer, a photosensitized layer applied to the solar cell anode paint layer, a solar cell cathode paint layer applied to the photosensitized paint layer, a diode paint circuit that is formed between the battery anode paint layer and the solar cell cathode paint layer, and a transparent protective layer applied to the solar cell cathode paint layer. The diode paint circuit is physically separated from each of the photosensitized paint layer, the solar cell anode paint layer, the battery cathode paint layer, and the ion bridge paint layer and includes an electron conducting paint layer and a hole conducting paint layer.

In some implementations, the painted circuit includes a transistor layer applied to less than all of the battery cathode layer and in electrical contact with the solar cell anode paint layer, a light-emitting circuit that is formed between the transistor paint layer and the transparent protective layer, and a conductor paint layer that is formed between the battery anode paint layer and the light-emitting circuit, wherein the conductor paint layer is physically separated from each of the ion bridge paint layer, the battery cathode paint layer, and the transistor paint layer. The light-emitting circuit is physically separated from the photosensitized paint layer and includes an electron conducting paint layer, a hole conducting paint layer, and a phosphorescent or electroluminescent paint layer between the electron conducting paint layer and the hole conducting paint layer.

In some implementations, the transistor paint layer includes a composition having a dielectric material that has a breakdown voltage that corresponds to a switching voltage of the transistor paint layer.

In some implementations, the phosphorescent paint layer includes an aqueous composition having one or more luminescent materials in an acrylic material.

In some implementations, the painted circuit has one or more paint layers of conductive paint, including an anode paint layer applied to the substrate, an ion bridge paint layer applied to less than all of the anode paint layer, a photosensitized/battery cathode paint layer applied to the ion bridge paint layer, a solar cell cathode paint layer applied to less than all of the photosensitized/battery cathode paint layer, and a transparent protective layer applied to the solar cell cathode paint layer.

In some implementations, the anode paint layer includes an aqueous composition having an anionic fast ion conductor and a salt in a weight ratio of water. The salt in the weight ratio of water can be water:salt:anionic fast ion conductor of 60:10:1.

In some implementations, the anode paint layer includes an electron acceptor, where the salt in the weight ratio of water:salt:electron acceptor:anionic fast ion conductor is 60:10:10:1. For example, the anode paint layer can include an anionic polyacrylamide in a weight ratio of water:titanium dioxide:potassium iodide:anionic polyacrylamide of 60:10:10:1.

In some implementations, the photosensitized/battery cathode paint layer includes an aqueous composition having a cationic fast ion conductor in a weight ratio of water, where the cationic fast ion conductor in the weight ratio of water is 60:1.

In some implementations, the photosensitized/battery cathode paint layer includes a cationic polyacrylamide in a weight ratio of water:cationic polyacrylamide of 60:1. The photosensitized-battery cathode paint layer can be an aqueous composition including a cationic fast ion conductor and a dye in a weight ratio of water:cationic fast ion conductor:dye of 6:1:1. For example, the photosensitized/battery cathode paint layer includes a cationic polyacrylamide and copper phthalocyanine in a weight ratio of water:cationic polyacrylamide:copper phthalocyanine of 6:1:1.

In some implementations, the ion bridge paint layer includes an aqueous composition having an ionic material and an ion-conducting polymer in a weight ratio of water.

In some implementations, the painted circuit has two or more contacts, each contact including a metallic foil affixed to a battery anode paint layer or a battery cathode paint layer and in electrical contact with the battery anode paint layer or the battery cathode paint layer, respectively.

In some implementations, the one or more paint layers of conductive paint include a solar cell anode paint layer applied to the substrate, a photosensitized paint layer applied to less than all of the solar cell anode paint layer, an output regulator circuit that is formed on top of the solar cell anode paint layer, a solar cell cathode paint layer applied to the photosensitized paint layer and the transistor paint layer, and a transparent protective paint layer applied to the solar cell cathode paint layer. The output regulator circuit includes a resistor paint layer and transistor paint layer, where the resistor paint layer is applied to the solar cell anode paint layer and is applied adjacent to the photosensitized layer, and the transistor paint layer is applied to the resistor paint layer.

In some implementations, the resistor paint layer includes an aqueous composition having an acrylic material and carbon black suspended in the acrylic material, where a weight ratio of carbon black in the acrylic material determines, in part, a resistance of the resistor paint layer.

In some implementations, the transistor paint layer includes a composition having a dielectric material that has a breakdown voltage that corresponds to a switching voltage of the transistor paint layer.

In some implementations, the solar cell cathode paint layer includes an aqueous composition having a cationic fast ion conductor in a weight ratio of water, where the cationic fast ion conductor in the weight ratio of water is 60:1.

In some implementations, the photosensitized paint layer includes an aqueous composition having an anionic fast ion conductor and a dye in a weight ratio of water:anionic fast ion conductor:dye of 6:1:1.

In general, another aspect of the subject matter described in this specification can be embodied in methods that include a process for manufacturing a painted circuit including, providing a substrate and applying one or more paint layers on a surface of the substrate, the one or more paint layers each forming an electrical component of the paint circuit element. A first paint layer of the one or more paint layers includes a conductive paint formulation having a resistance that is defined by a concentration of conductive material that is included in the conductive paint formulation and a thickness of the given paint layer, and wherein lower concentrations of the conductive material included in the conductive paint formulation provide a higher resistance than higher concentrations of conductive material. Other embodiments of this aspect include corresponding systems, apparatus, and computer programs, configured to perform the actions of the methods, encoded on computer storage devices.

These and other embodiments can each optionally include one or more of the following features. In some implementations, a process for manufacturing a painted circuit includes applying a battery anode paint to the substrate to yield a layer of the battery anode paint in direct contact with the substrate, applying an ion bridge paint to less than all of the battery anode paint layer to yield a layer of ion bridge paint in direct contact with the battery anode paint layer, applying a battery cathode paint to the ion bridge paint layer to yield a layer of battery cathode paint in direct contact with the ion bridge paint layer, applying a solar cell anode paint to less than all of the battery cathode paint layer to yield a layer of solar cell anode paint in direct contact with the battery cathode paint layer, applying a photosensitized paint to the solar cell anode paint layer to yield a layer of photosensitized paint in direct contact with the solar cell anode paint layer, applying a solar cell cathode paint to the photosensitized paint layer to yield a layer of solar cell cathode paint in direct contact with the photosensitized paint layer, forming a diode paint circuit between the battery anode paint layer and the solar cell cathode layer, and applying a transparent protective paint to the solar cell cathode paint layer to yield a layer of transparent protective paint in direct contact with the solar cell cathode paint layer.

Forming a diode paint circuit includes applying an electron conducting paint to less than all of the battery anode paint layer to yield a layer of electron conducting paint in direct contact with the battery anode paint layer, and applying a hole conducting paint to the electron conducting paint layer to yield a layer of hole conducting paint in direct contact with the electron conducting paint layer, where the diode paint circuit is formed and is physically separated from each of the photosensitized paint layer, the solar cell anode paint layer, the battery cathode paint layer, and the ion bridge paint layer.

In some implementations, a process for manufacturing a painted circuit includes applying a transistor paint to less than all of the battery cathode layer to yield a layer of transistor paint in direct contact with the battery cathode layer and in electrical contact with the solar cell anode paint layer, forming a light-emitting circuit between the transistor paint layer and the transparent protective paint layer, and applying a conductor paint to less than all of the battery anode paint layer to yield a layer of conductor paint in direct contact with the battery anode paint layer and the light-emitting circuit and is physically separated from each of the ion bridge paint layer, the battery cathode paint layer, and the transistor paint layer. Forming a light-emitting circuit includes applying an electron conducting paint to less than all of the transistor paint layer to yield a layer of electron conducting paint in direct contact with the transistor paint layer, applying a phosphorescent paint to the electron conducting paint layer to yield a layer of phosphorescent paint in direct contact with the electron conducting paint layer, applying a hole conducting paint to the phosphorescent paint layer to yield a layer of hole conducting paint in direct contact with the phosphorescent paint layer, where the light-emitting circuit is formed and is physically separated from the photosensitized paint layer.

In some implementations, a dielectric material is combined with a paint binder to yield a mixture and yield a transistor paint.

In some implementations, a phosphorescent material is combined with water to yield a mixture, and a polymer host material is dissolved in the mixture to yield a phosphorescent paint.

In some implementations, a process for manufacturing a painted circuit includes applying an anode paint to the substrate to yield a layer of anode paint in direct contact with the substrate, applying an ion bridge paint to less than all of the anode paint layer to yield a layer of ion bridge paint in direct contact with the anode paint layer, applying a photosensitized/battery cathode paint to the ion bridge paint layer to yield a layer of photosensitized/battery cathode paint in direct contact with the ion bridge paint layer, applying a solar cell cathode paint to less than all of the photosensitized/battery cathode paint layer to yield a layer of solar cell cathode paint in direct contact with the photosensitized/battery cathode paint layer, and applying a transparent protective layer paint to the solar cell cathode paint layer to yield a layer of transparent protective paint in direct contact with the solar cell cathode paint layer.

In some implementations, a cationic fast ion conductor is dissolved in water to yield a hole transport paint.

In some implementations, a salt is dissolved in water to yield a salt solution, an electron acceptor is combined with the salt solution to yield a mixture, and an anionic fast ion conductor is dissolved in the mixture to yield an electron transport paint.

In some implementations, a dye is combined with water to yield a mixture, and an anionic fast ion conductor is dissolved in the mixture to yield a photosensitizing paint.

In some implementations, an ionic material is combined with water to yield a mixture, and an ionic-conducting material is dissolved in the mixture to yield ion bridge paint.

In some implementations, a process for manufacturing a painted circuit includes applying an electron transport paint to the substrate to yield a layer of the electron transport paint in direct contact with the substrate, applying an electroluminescent paint to the electron transport paint layer to yield a layer of the electroluminescent paint in direct contact with the electron transport paint layer, and applying a hole transport paint to the electroluminescent paint layer to yield a layer of the hole transport paint in direct contact with the electroluminescent paint in direct contact with the electroluminescent paint layer.

In some implementations, an electroluminescent material is combined with water to yield a mixture, and a polymer host material is dissolved in the mixture to yield an electroluminescent paint.

In some implementations, a process for manufacturing a painted circuit includes applying an anode paint to the substrate to yield a layer of anode paint in direct contact with the substrate, applying a photosensitized paint to less than all of the solar cell anode paint layer to yield a layer of photosensitized paint in direct contact with the solar cell anode paint layer, forming an output regulator circuit on top of the solar cell anode paint layer, applying a solar cell cathode paint to the photosensitized paint layer and the transistor paint layer to yield a layer of solar cell cathode paint in direct contact with the photosensitized paint layer and the transistor paint layer, and applying a transparent protective paint to the solar cell cathode paint layer to yield a layer of transparent protective paint in direct contact with the solar cell cathode paint layer. Forming an output regulator circuit includes applying a resistor paint to less than all of the solar cell anode paint layer to yield a layer of resistor paint in direct contact with the solar cell anode paint layer and adjacent and in electrical contact to the photosensitized paint layer, and applying a transistor paint to the resistor paint layer to yield a layer or transistor paint in direct contact with the resistor paint layer.

In some implementations, a conductive material is combined with water to yield a mixture, and an acrylic material is dissolved in the mixture to yield resistor/conductor paint.

In some implementations, a process for manufacturing a painted circuit includes applying an electron transport paint to the substrate to yield a layer of the electron transport paint in direct contact with the substrate, applying a photosensitizing paint to the electron transport paint layer to yield a layer of the photosensitizing paint in direct contact with the electron transport paint layer, and applying a hole transport paint to the photosensitizing paint layer to yield a layer of the hole transport paint in direct contact with the photosensitizing paint in direct contact with the photosensitizing paint layer.

Particular embodiments of the subject matter described in this specification can be implemented to realize one or more of the following advantages. Unlike traditional commercial solar cell fabrication, solar paint circuits can be fabricated with few tools (e.g., a hand mixer and a paint brush) by individuals in any location (e.g., even in remote regions that do not have access to electricity or other resources required by conventional approaches). The solar paint circuits discussed herein are created using combinations of basic, inexpensive materials to form electronic circuits, which reduces fabrication complexity and reduces the cost to the manufacturer and end-user. In general, many of the materials used in the solar paint circuits are less hazardous and are less expensive to manufacture and ship than materials used in traditional solar cells. The paint circuits described here have a reduced upfront capital expenditure requirement relative to traditional circuit fabrication and can be fabricated on-site as result, reducing import/export tax or customs duty in countries where traditional circuit fabrication facilities cannot be established. Additionally, existing infrastructure in commonly found paint factories can be converted easily to produce solar paint circuits, whereas traditional solar cell fabrication requires highly specialized equipment. The relationship between the electrically active material and its paint substrate enable the electrical properties of the paint to be selected using relatively simple mathematical analyses. Additionally, the ability to control the viscosity of the paint and/or the number of layers applied enables the electrical characteristics to be easily changed by changing the viscosity and/or the number of layers of paint applied. This type of flexibility is typically unavailable with more conventional, high-precision circuit fabrication methods.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

FIGS. 1A and 1B are block diagrams of example solar paint circuits.

Like reference numbers and designations in the various drawings indicate like elements.

DETAILED DESCRIPTION

Overview

Figure 1B:
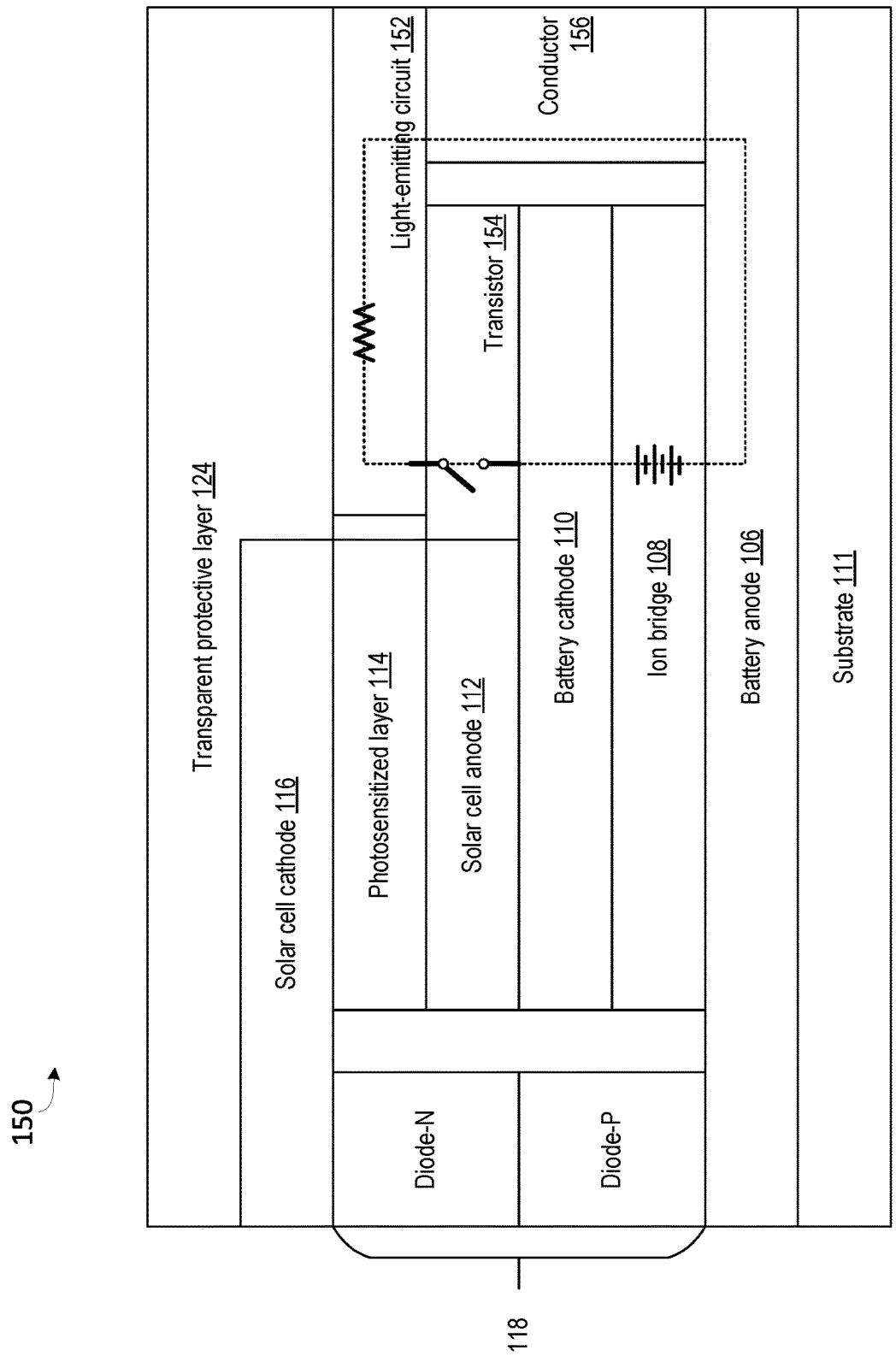

Described below are devices, systems, and methods for producing solar paint and solar paint circuits. A paint circuit (e.g., a solar paint circuit) is created through a layer-by-layer application of electrically conductive paint (e.g., solar paint) to a surface of a substrate. The substrate can be, for example, a piece of wood, brick, plaster, stone, metal surface, or another surface to which paint can be applied. The application of layers of solar paint to the substrate can be done by hand using a paintbrush or another form of simple spreading tool.

Though the term "solar paint circuit," and "solar paint" are used in the context of describing particular embodiments of the subject matter, it is not meant to be limiting. Other paint circuits can be implemented which do not integrate solar energy (e.g., a battery, a light-emitting diode, an antenna, or other circuit elements), as well as paint layers that are not directly involved in forming solar-integrating circuits.

In some implementations, a painted circuit can be created by applying a single paint layer to a substrate. For example, a simple resistive circuit can be created by applying a single paint layer to the substrate. As discussed in more detail below, the paint layer applied to the substrate can be a conductive paint formulation having a resistance that is defined by a concentration of conductive material that is included in the conductive paint formulation and thickness of the paint layer. In some implementations, when lower concentrations of the conductive material are included in the paint formulation, the resistance of the paint formulation will be higher than when higher concentrations of the conductive material are included in the paint formulation.

In some implementations, a paint layer is applied through a template (e.g., a mask, stencil, and/or screen printing tool), such that paint is applied to a substrate in a portion of the template but is prevented from being applied to the substrate in a second, different portion of the template.

In some implementations, multiple paint layers are applied to the substrate to create a painted circuit. For example, after a first layer of paint is applied to the portion of the substrate, other layers can be applied to other portions of the substrate (e.g., adjacent to the first layer) and/or applied to already painted portions of the substrate (e.g., applied over the first layer of paint). Each layer of paint forms an electrical component of the painted circuit (e.g., an electron transport layer, a hole transport layer, etc.).

A paint layer can include a conductive paint formulation where a resistance of the paint layer is defined by a concentration of conductive material (e.g., carbon black) that is incorporated into the conductive paint formulation, and a thickness of the given paint layer. Paint layers with lower concentrations of conductive material in the conductive paint formulation will have higher resistances than paint layers with higher concentrations of the conductive material. Adjusting a viscosity of the paint layer can change a thickness of the paint layer applied to the substrate, which in turn will affect the resistance of the paint layer. For example, a paint formulation with a higher viscosity will result in a thicker paint layer than a paint formulation with a lower viscosity, and thicker layers of paint will generally have higher resistance in a direction perpendicular to the plane of the layer than thinner layers of similar formulation.

As described in more detail below, various types of circuits and devices can be fabricated using solar paint. Several examples circuits are described below, but other circuits can be created using the techniques described below. Examples of solar paint circuits described below include, a solar battery, where a solar cell charges a battery. Another example of a solar paint circuit is a solar-powered streetlight, including a solar cell, a battery, and a light-emitting circuit. Another example of a solar paint circuit is a solar cell including an output regulator to regulate the solar cell to a maximum power point of the solar cell, which can be used as part of a cell phone charging circuit. As described in more detail below, various circuit elements, such as resistors, capacitors, diodes, and transistors, can be fabricated using the solar paint described herein.

Though the example circuits described below are depicted in block diagram form as single layers of each respective paint layer, multiple applications (e.g., multiple layers) of particular paint layers can be used to achieve desirable electrical and/or functional properties. Additionally, though the examples depicted below describe single sub-circuits (e.g., a single solar cell, a single solar battery) integrated and/or painted on one paint circuit, multiple sub-circuits may be incorporated and/or painted to form a larger paint circuit (e.g., multiple solar cells) to achieve desired device performance).

Example Solar Paint Circuits

FIG. 1A is a block diagram of an example solar paint circuit 100. The solar paint circuit 100 includes a solar battery 102, a solar cell 104, a transparent protective layer 124, and a diode paint circuit 118. The solar battery 102 is formed by a battery anode paint layer 106, an ion bridge paint layer 108, and a battery cathode paint layer 110. The battery anode paint layer 106 can be created using a painted layer that is applied to a substrate 111 (e.g., a surface composed of wood, metal, plaster, stone, brick, or another paintable material). The battery anode paint layer 106 forms an anode for the solar battery 102. The battery anode paint layer 106 can be formed by an aqueous paint composition including an anionic fast conductor and an electron acceptor. Formulations for the battery anode paint layer 106 are discussed in further detail below.

In some implementations, rather than using a paint layer to form the battery anode paint layer 106, an electrically conductive substrate 111 (e.g., a metal surface) can be used as the battery anode. In some implementations, rather than using a paint layer to form the battery anode paint layer 106, an electrically conductive mesh and/or foil (e.g., a wire mesh) is affixed to the substrate 111 and can be used as the battery anode.

The ion bridge paint layer 108 is applied to a portion of the battery anode paint layer 106. The ion bridge paint layer 108 forms an ion bridge for the solar battery 102 as a pathway for ions to move between the battery anode paint layer 106 to the battery cathode paint layer 110. The ion bridge paint layer 108 can be formed by an aqueous paint composition including an ion-conductive polymer and an ionic material. Formulations for the ion bridge paint layer 108 are discussed in further detail below. In some implementations, the ion bridge paint layer 108 is applied in a manner such that less than all of the battery anode paint layer 106 is covered by the ion bridge paint layer 108. For example, as shown in FIG. 1A, the ion bridge paint layer 108 does not cover the entirety of the battery anode paint layer 106.

The battery cathode paint layer 110 is applied to the ion bridge paint layer 108. The battery cathode paint layer 110 forms a cathode for the solar battery 102. The battery cathode paint layer 110 can be formed by an aqueous paint composition including a cationic fast ion conductor. Formulations for the battery cathode paint layer 110 are discussed in further detail below. As shown, the top surface of the battery cathode paint layer 110 is in physical and electrical contact with the solar cell 104, which is described in more detail below.

The solar cell 104 includes a solar cell anode paint layer 112, a photosensitized paint layer 114, and a solar cell cathode layer 116. Solar cell 104 is an electrical device that converts the energy of light (e.g., sunlight) into electricity. Photons (e.g., sunlight) are absorbed in the photosensitized paint layer 114, and charge generation of electrons and holes occurs. The generated charges are then separated and the electrons move towards the cathode and holes move towards the anode, respectively, to generate electricity.

The solar cell anode paint layer 112 is applied to at least a portion of the battery cathode paint layer 110. The solar cell anode paint layer 112 forms an anode for the solar cell 104. In some implementations, the solar cell anode paint layer 112 is applied in a manner such that less than the entirely of the battery cathode paint layer 110 is covered by the solar cell anode paint layer 112. The photosensitized paint layer 114 is applied to the solar cell anode paint layer 112.

The photosensitized paint layer 114 forms a layer where photons can be absorbed and charge generation takes place in the solar cell 104. The photosensitized paint layer 114 can be formed from a paint composition including a dye and an anionic fast ion conductor. Formulations for the photosensitized paint layer 114 are discussed in further detail below.

The solar cell cathode paint layer 116 is applied to the photosensitized paint layer 114. The solar cell cathode paint layer 116 forms a cathode for solar cell 104. The solar cell cathode paint layer 116 can be transparent or semi-transparent to allow light to reach the photosensitized paint layer 114 below. In some implementations, rather than a solar cell cathode paint layer 116, an electrically conductive mesh (e.g., a wire mesh) is used as a cathode layer for solar cell 104.

A diode paint circuit 118 is formed between the battery anode paint layer 106 and the solar cell cathode paint layer 116. The diode paint circuit 118 forms a diode in which the flow of current is only allowed in a single direction under normal operation, for example, a forward direction from the solar cell 104 to the solar battery 102. The diode paint circuit 118, under normal operations, prevents electricity from flowing "backwards" from the solar battery 102 to the solar cell 104. The diode paint circuit 118 includes a p-type diode paint layer 120, which is applied to a portion of the battery anode paint layer 106, and an n-type diode paint layer 122, which is applied to the p-type diode paint layer 120. The p-type diode paint layer 120 and the n-type diode paint layer 122 form a p-n junction for the diode paint circuit 118. A top surface of the n-type diode paint layer 122 is in physical and electrical contact with the solar cell cathode paint layer 116, e.g., the solar cell cathode paint layer is applied to the n-type diode paint layer 122. The diode paint circuit 118 is physically separated from the ion bridge paint layer 108, the battery cathode paint layer 110, the solar cell anode paint layer 112, and the photosensitized paint layer 114. The physical separation between the diode paint circuit 118 and the ion bridge paint layer 108, the battery cathode paint layer 110, the solar cell anode paint layer 112, and the photosensitized paint layer 114 can be an air gap and/or filled with an electrically insulating material (e.g., a resin). Formulations for the p-type diode paint layer 120 and the n-type diode paint layer 122 are discussed in further detail below.

In one example, a standalone diode paint circuit 118 is formed by applying three layers of a p-type diode paint on top of an electrically conductive substrate (e.g., aluminum foil) to form a p-type diode paint layer 120 followed by applying two layers of an n-type diode paint on top of the p-type diode paint layer 120 to form a n-type diode paint layer 122. A top contact including a protective coating layer (e.g., a layer of indium tin oxide coated on a sheet of clear plastic film) is brought into electrical and physical contact with the n-type diode paint layer 122.

In some implementations, respective thicknesses of the p-type diode paint layer 120 and the n-type diode paint layer 122 exceed respective threshold thicknesses such that the two layers form a p-n junction. For example, if the thickness of the p-type diode paint layer 120 and/or the thickness of the n-type diode paint layer 122 is below respective threshold, then a p-n junction is not formed (e.g. the diode 118 does not function as a p-n junction). In some implementations, a threshold thickness is determined in part by the materials forming the n-type diode paint layer 122 and/or the p-type diode paint layer 120, as well as an operating voltage for the p-n junction formed. In general, the threshold thickness depends, in part, on a quantum tunneling limit of the layer, where above the threshold thickness quantum tunneling becomes highly improbable. For example, a threshold thickness is on the order of a few nanometers of paint layer in a direction normal to the substrate 111.

In some implementations, respective thicknesses of the paint layers in contact with the diode 118 (e.g., battery anode paint layer 106 and solar cell cathode paint layer 116) are below respective threshold thicknesses such that a p-n junctions are not formed between the paint layers in contact with the diode 118. For example, a p-n junction is not formed between the p-type diode paint layer 122 and the battery anode paint layer 106 and a p-n junction is not formed between the n-type diode paint layer 122 and the solar cell cathode paint layer 116 in part, because the battery anode paint layer 106 and the solar cell cathode paint layer 116 are below respective threshold thicknesses for forming a p-n junction.

A transparent protective paint layer 124 is applied to the solar cell cathode paint layer 116. The transparent protective paint layer 124 can be a transparent protecting coating and can also be electrically insulating (e.g., laminate, polyurethane finish, shellac). In some implementations, the transparent protective paint layer 124 encapsulates a portion or all of the exposed surfaces of the solar circuit 100. The transparent protective paint layer 124 forms a protective layer over part or all of the solar circuit 100 to protect the solar circuit 100 paint layers from environmental effects (e.g., UV radiation, weather, water/humidity). In some implementations, the transparent protective paint layer 124 is semi-transparent, and/or only transparent to certain wavelengths ranges (e.g., transparent to visible wavelengths). In some implementations, the transparent protective layer 216 is omitted, depending in part on application and/or environmental factors (e.g., level of exposure to weather). When the transparent protective layer 216 is omitted, the solar cell cathode paint layer 116 can function as a conductive protective layer (e.g., indium tin oxide).

The solar cell 104 operates to absorb photons from the ambient environment (e.g., solar rays) in the photosensitized paint layer 114, such that electron-hole pairs are formed within the photosensitized paint layer 114, and charge separation occurs between the solar cell anode paint layer 112 and the solar cell cathode paint layer 116. The separated charges are then used to charge (e.g., trickle charge) the solar battery 102 by producing a charge imbalance across the ion bridge 108, and using the diode paint circuit 118 as a blocking diode where the diode paint circuit 118 allows the solar cell 104 to charge the solar battery 102 without allowing the solar battery 102 to discharge when a discharge voltage of the solar battery 102 is higher than a voltage across the solar cell 104 (e.g., in the dark).

The solar circuit 100 can be combined with other circuit elements to produce a solar-powered light (e.g., a solar-powered streetlight). FIG. 1B is block diagram of an example solar paint circuit 150. The solar circuit 150 includes a solar battery 102, a solar cell 104, and a light-emitting circuit 152. The solar cell 104 can be used to generate electricity from sunlight to charge (e.g., trickle charge) the solar battery 102, which can then be used to power a light-emitting circuit 152. The powered light-emitting circuit 152 can emit light in a particular range of wavelengths (e.g., visible light).

The light-emitting circuit 152 is electrically connected to the battery cathode paint layer 110 by a transistor paint layer 154, which functions as a transistor. In some implementations, the transistor paint layer 154 is applied to less than the entire battery cathode paint layer 110. For example, as shown in FIG. 1B, the transistor paint layer 154 is applied to the portion of the battery cathode paint layer 110 that is not covered by the solar cell anode paint layer 112. As shown, the transistor paint layer 154 is in physical contact with the solar cell anode paint layer 112. That is, the transistor paint layer 154 and the solar cell anode paint layer 112 are both applied to the battery cathode paint layer 110 in adjacent layers (e.g., painted side-by-side).

The light-emitting circuit 152 is formed between the transistor paint layer 154 and the transparent protective layer 124. The light-emitting circuit 152 is physically separated from the photosensitized paint layer 114 (e.g., an air gap or insulating materials is between the photosensitized paint layer and the light-emitting circuit 152). The light-emitting circuit 152 can include an electron conducting paint layer (e.g., an anode), a hole conducting paint layer (e.g., a cathode), and a light-emitting paint layer and/or electroluminescent paint layer (e.g., a light-emitting polymer) between the electron conducting paint layer and the hole conducting paint layer.

The electron conducting paint layer, hole conducting paint layer and light-emitting paint layer form a light-emitting diode, where electrons are provided into the light-emitting circuit 152 through the electron conducting paint layer and holes are provided into the light-emitting circuit 152 through the hole conducting paint layer. Electrons and holes from the electron conducting paint layer and hole conducting paint layers, respectively, recombine in the light-emitting layer and generate photons of a particular wavelength. In some implementations, the light-emitting paint layer is a phosphorescent paint layer. The light-emitting paint layer can be a fluorescent paint layer.

The light-emitting paint layer of the light-emitting circuit 152 can emit light vertically through a transparent hole conducting paint layer and the transparent protective layer 124, and/or laterally through one or more edges of the light-emitting paint layer of the light-emitting circuit 152.

A conductor paint layer 156 (or multiple conductor layers applied on top of each other) is formed between the battery anode paint layer 106 and the light-emitting circuit 152. The conductor paint layer 156 forms a conductive path for a flow of current between the battery anode paint layer 106 and the light-emitting circuit 152. The conductor paint layer 156 can be formed from a paint composition including an acrylic material and a conductive material (e.g., carbon black). Formulations for conductive paint is discussed in further detail below. The conductor paint layer 156 is physically separated from the ion bridge paint layer 108, the battery cathode paint layer 110, and the transistor paint layer 154.

The conductor paint layer 156 acts as an electrical bridge between the battery anode paint layer 106 and the light-emitting circuit 152, such that the solar battery 102 provides electrical charge to the light-emitting circuit 152 to operate the light-emitting circuit 152 (e.g., emit light). The transistor paint layer 154 electrically connects the light-emitting circuit 152 to the battery cathode paint layer 110 to complete the electrical circuit 158. The transistor paint layer 154 can operate as a "switch" where the layer of transistor paint can be switched "off" when a sum of voltages of a high-voltage side (e.g., a voltage at the battery anode 106) exceeds a certain application specific value, or can be switched "on" by applying an additional "base" voltage on a low-voltage side (e.g., a voltage at the battery cathode 110).

Figure 2:
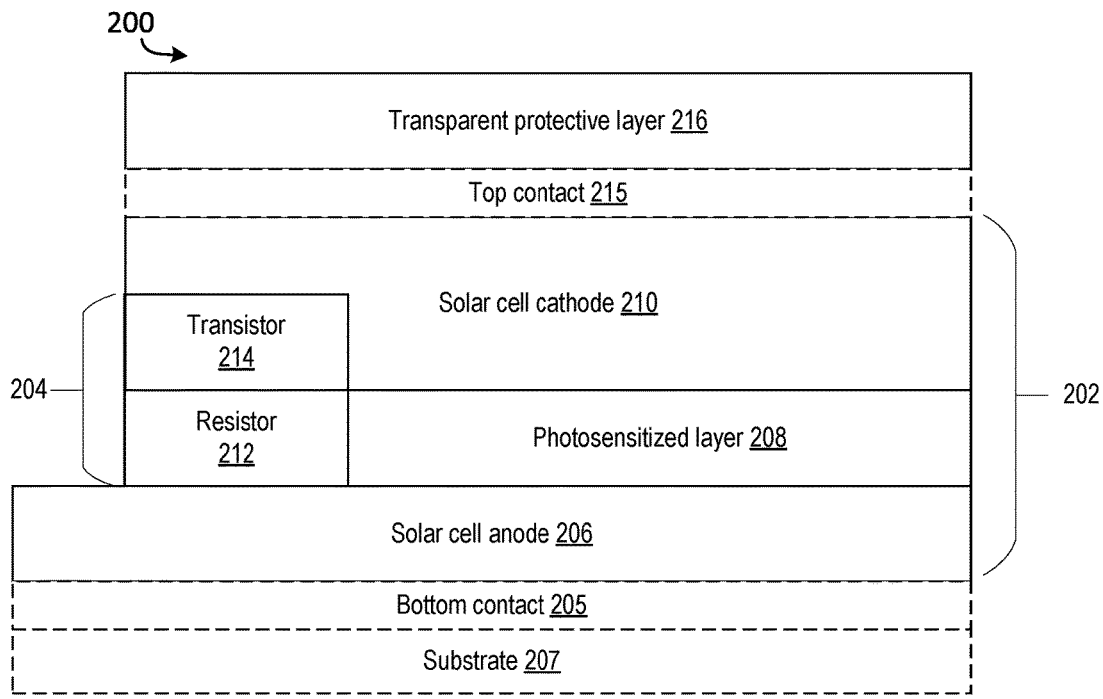
FIG. 2 is a block diagram of another example solar paint circuit.

FIG. 2 is a block diagram of another example solar paint circuit 200. The output-regulated solar cell 200 includes a solar cell 202, similar to solar cell 104 described with reference to FIG. 1A, and an output regulator circuit 204. Solar cell 202 includes a solar cell anode paint layer 206 applied to a bottom contact 205 (e.g., a wire mesh or foil) on a surface of a substrate 207 (e.g., wood, fabric, plaster, etc.). In some implementations, the solar cell anode paint layer 206 is applied directly to the substrate 207. In some implementations, rather than a solar cell anode paint layer 206, the substrate 207 is an electrically conductive substrate (e.g., a metal foil or shingle), and a photosensitized layer 208 is a first layer applied to the substrate 207.

A photosensitized paint layer 208 is applied to a portion of the solar cell anode paint layer 206. The photosensitized paint layer 208 can be applied to less than the entirety of the solar cell anode paint layer 206, such that a part of a top surface of the solar cell anode paint layer 206 is exposed. The photosensitized paint layer 208 forms a layer where photons can be absorbed and charge generation takes place in the solar cell 202.

A solar cell cathode paint layer 210 is applied to the photosensitized paint layer 208. The solar cell cathode paint layer 210 forms a cathode for the solar cell 202. The solar cell cathode paint layer 210 can be transparent or semi-transparent to allow light to reach the photosensitized paint layer 208 below. In some implementations, rather than a solar cell cathode paint layer 210, an electrically conductive mesh (e.g., a wire mesh) is used as a cathode layer for solar cell 202.

The output regulator circuit 204 is formed between an exposed surface of the solar cell anode paint layer 206 and the solar cell cathode paint layer 210. The output regulator circuit 204 is formed to regulate the output of the solar cell 202 to its maximum power point (MPP). The output regulator circuit 204 includes a resistor paint layer 212 and transistor paint layer 214. The resistor paint layer 212 is applied to the solar cell anode paint layer 206, such that the resistor layer 212 is in physical and/or electrical contact with the photosensitized layer (e.g., the resistor paint layer 212 and photosensitized paint layer 208 are applied adjacent to each other). The resistor paint layer 212 forms a resistor in the output regulator circuit 204.

The transistor paint layer 214 is applied to the resistor paint layer. The transistor paint layer 214 is in physical and electrical contact with the solar cell cathode paint layer 210. The transistor paint layer 214 forms a transistor in the output regulator circuit 204. In some implementations, a portion of the solar cell cathode paint layer 210 is adjacent to the transistor paint layer 214. The solar cell cathode paint layer 210 can be applied to a top surface of the transistor paint layer 214.

In some implementations, a top contact 215 is formed on a top surface of the solar cell cathode paint layer 210. A top contact can include a metallic mesh (e.g., copper, tin, steel), or indium tin oxide.

A transparent protective layer 216 is applied to the top contact 215 or the solar cell cathode paint layer 210. In some implementations, the transparent protective layer 216 encapsulates a portion or all of the exposed surfaces of the output-regulated solar cell 200. In some implementations, the top contact (e.g., indium tin oxide layer) is the transparent protective layer. The transparent protective paint layer 216 forms an electrically insulating and protective layer over part or all of the output-regulated solar cell 200 to protect the paint layers from environmental effects (e.g., UV radiation, weather, water/humidity). In some implementations, the transparent protective paint layer 216 is semi-transparent, and/or only transparent to certain wavelengths ranges (e.g., transparent to visible wavelengths). In some implementations, the transparent protective layer 216 is omitted, depending in part on application and/or environmental factors (e.g., level of exposure to weather).

The output-regulated solar cell 200 is designed to regulate the output of the solar cell 202 to its maximum power point (MPP). This can be accomplished by selecting a formulation of the transistor paint layer 214 such that a breakdown voltage of the transistor paint layer is equal to the solar cell 202 MPP. Additionally, the formulation of the resistor paint layer 212 is selected such that the output voltage of the solar cell 202 remains equal to the breakdown voltage of the transistor paint layer 214 during the operation of the output-regulated solar cell 200. Particular formulations for the respective layers are described in more detail below.

In some implementations, multiple solar cells 202 are connected together in series with a single output regulator circuit 204 to control the output between the multiple solar cells 202. Connecting multiple solar cells 202 together in series can increase the amount of electricity generated and available to power another circuit (e.g., a light-emitting circuit, a cell phone device, etc.) or charge a solar battery.

Figure 3:
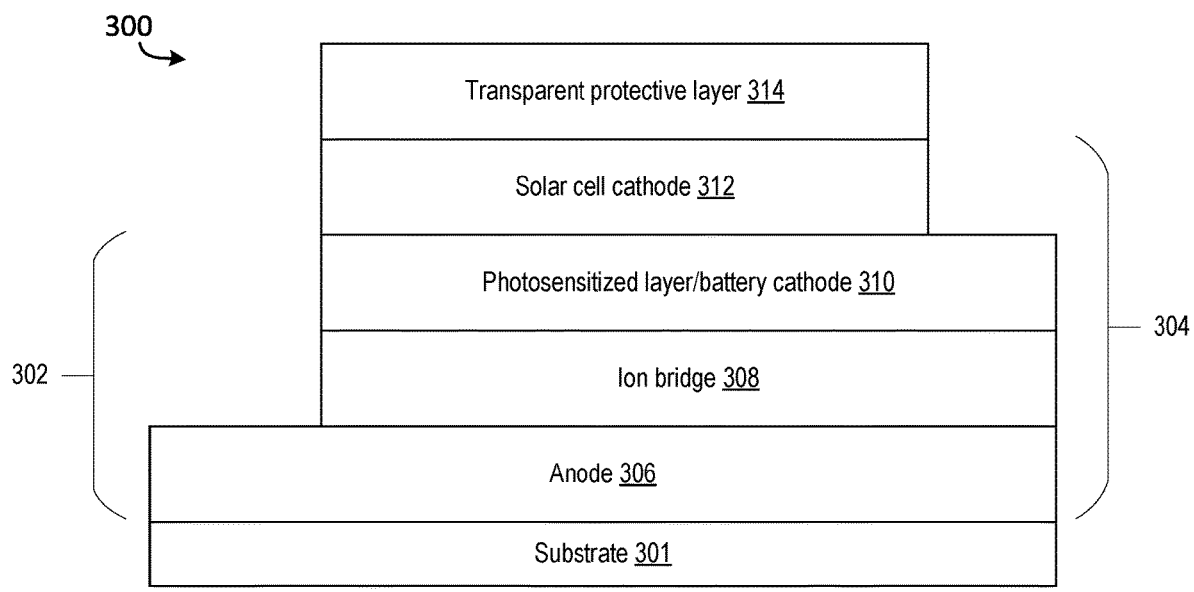
FIG. 3 is a block diagram of another example solar paint circuit.

FIG. 3 is a block diagram of another example solar paint circuit. The condensed solar circuit 300 shown in FIG. 3 includes a solar battery 302 and a solar cell 304, similarly to the solar circuit 100 described with reference to FIG. 1A, where the solar cell 304 can absorb photons (e.g., sunlight) to generate electricity to charge solar battery 302. The condensed solar battery 300 includes multi-functional paint layers, where each of the paint layers can perform a function (e.g., is an component of a circuit element) for both the solar battery 302 and the solar cell 304. For example, an anode paint layer 306 is applied to a surface of a substrate (e.g., metal surface). The anode paint layer 306 can function as an electrical anode for both the solar battery 302 and the solar cell 304.

An ion bridge paint layer 308 is applied to the anode paint layer 306. In some implementations, the ion bridge paint layer 308 is applied to less than all of the anode paint layer 306, such that part of a top-surface of the anode paint layer 306 is exposed after the ion bridge paint layer 308 is applied. In some implementations, the ion bridge paint layer 308 can entirely cover one side of the anode paint layer 306.

A photosensitized/battery cathode paint layer 310 is applied to the ion bridge paint layer 308. The photosensitized/battery cathode paint layer 310 can have multiple functions, including serving as a photosensitized layer for absorbing photons and generating electron-hole pairs for the solar cell 304, as well as serving as a battery cathode layer for the solar battery 302.

A solar cell cathode paint layer 312 is applied to the photosensitized/battery cathode paint layer 310. The solar cell cathode paint layer 312 forms a cathode for the solar cell 304. In some implementations, the solar cell cathode paint layer 312 is applied to less than the entire photosensitized/battery cathode paint layer 310, such that a part of a top-surface of the photosensitized % battery cathode paint layer 310 is exposed. The solar cell cathode paint layer 312 can be semi-transparent or transparent to allow light to reach the photosensitized % battery cathode paint layer 310.

A transparent protective layer 314 is applied to the solar cell cathode paint layer 312. In some implementations, the transparent protective layer 314 encapsulates a portion or all of the exposed surfaces of the output-regulated solar cell 300, and can be electrically insulating. The transparent protective paint layer 314 forms a protective layer over part or all of the condensed solar circuit 300 to protect the paint layers from environmental effects (e.g., UV radiation, weather, water/humidity). In some implementations, the transparent protective paint layer 314 is semi-transparent, and/or only transparent to certain wavelengths ranges (e.g., transparent to visible wavelengths). In some implementations, the transparent protective layer 314 is omitted, depending in part on application and/or environmental factors (e.g., level of exposure to weather). When the transparent protective layer 314 is omitted, the solar cell cathode paint layer 312 can function as a conductive protect layer (e.g., indium tin oxide).

In some implementations, multiple solar circuits are electrically connected together to form larger systems of circuits. The multiple solar circuits can be of a same or of different types, and can be connected together in series and/or in parallel, depending on functionality of the larger system. For example, multiple solar cells can be connected in series to one or more solar batteries such that multiple solar cells can be used to charge a solar battery, increasing throughput.

In some implementations, electrical contacts can be included in any of the solar circuits (e.g., solar circuits 100, 150, 200, 300) discussed herein. The electrical contacts can include a first contact (e.g., metallic foil, metallic mesh, cold weld bonding compound, solder ball, alligator clip, or the like) affixed to an anode paint layer (e.g., battery anode paint layer 206, anode paint layer 306, battery anode paint layer 106). A second contact (e.g., metallic foil, metallic mesh, cold weld bonding compound, solder ball, alligator clip, or the like) can be affixed to a cathode paint layer (e.g., battery cathode paint layer 110, solar cell cathode paint layer 210, photosensitized/battery cathode paint layer 310). The electrical contacts can be used to connect to the solar circuit to an external device (e.g., a mobile phone, computer, or other battery-operated device). The electrical contacts can also be used to connect the solar circuit to other solar circuits, for example, to daisy-chain a set of solar cell painted circuits, to increase throughput for powering and/or charging a user device (e.g., a cell phone or computer), or charging a solar battery.

Example Process for Producing Solar Paint Formulations

Solar circuits and devices, including those described herein with reference to FIGS. 1-3, include multiple layers of solar paint. Solar paint can include various formulations selected to give the solar paint layers applied with the particular solar paint different electrical (e.g., resistive/conductive), reactive (e.g., photo-reactive), dielectric (e.g., voltage breakdown) and physical properties (e.g., viscosity). In some implementations, paint formulations are aqueous and include water, a solvent (e.g., ethanol), and/or an emulsifier.

Implementations of solar paints include resistor/conductor paint (e.g., for resistor paint layers and conductor paint layers) and transistor paint (e.g., for transistor paint layers). The resistor paint can be an aqueous composition including an acrylic material mixed with one or more conductive materials. Examples of suitable acrylic materials include polyacrylic acid (PAA), polymethyl acrylate (PMA), and polymethyl methacrylate (PMMA). Examples of suitable conductive materials include aluminum, graphite, activated carbon, amorphous carbon, tungsten, zinc, carbon black, conductive nanomaterial such as nanoparticles (e.g., copper (II) oxide), and conductive polymers (e.g., polvaniline, spiro-OMeTAD, polyphenylene, poly(flurorene), polypyrene, polyazulene, polynapthalene, poly(pyrrole), polycarbazole, polyindole, polvazepine, poly(theiophene), poly (3,4-ethylenedioxythiophene), poly(p-phenylene sulfide), poly(acetylene), poly(p-phenylene vinylene)).

In some implementations, conductive nanomaterials (e.g., nanoparticles) are selected based in part on a transparency of the resulting resistor/conductor paint including the conductive nanomaterials. Additionally, deflocculants (e.g., sodium lauryl dodecasulfide or a basic salt like sodium carbonate or potassium carbonate) can be added to the resist/conductor paint including the conducting nanomaterials to prevent flocculation, minimize surface energy of the dispersed nanoparticles, and assist in dispersion of the nanomaterials and improve transparency.

Figure 4:
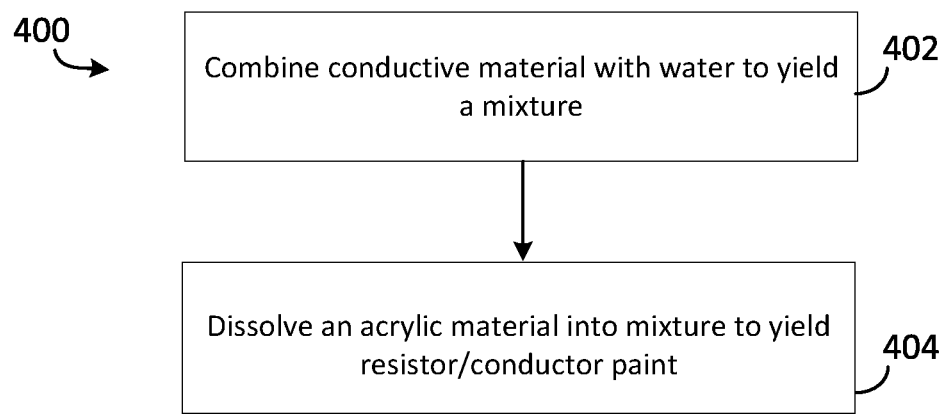
FIG. 4 is a flow chart of an example process for producing resistor/conductor paint.

FIG. 4 is a flow chart of an example process for producing solar paint. Referring to FIG. 4, resistor/conductor paint can be prepared by process 400. In 402, a suitable conductive material is combined with water to yield a mixture. In 404, a suitable acrylic material is combined with the mixture and agitated gently, avoiding introduction of air bubbles, to yield the resistor/conductor paint. A weight ratio of the conductive material in the acrylic material determines, in part, a resistance of the resistor paint layer. For weight ratios of conductive material above a conductivity threshold, the weight ratio of the conductive material in the acrylic material determines, in part, the conductivity of the conductor paint layer.

The transistor paint can be a composition including a dielectric material, where the dielectric material has a breakdown voltage that corresponds to a desired switching voltage of the transistor paint layer, and a paint binder. The breakdown voltage is a minimum voltage that causes a portion of an insulating material to become electrically conductive. Examples of suitable dielectric materials for transistor paint layers include low-k dielectric materials such as silicon dioxide, or silicon dioxide doped with carbon and/or fluorine. Acrylic or polyurethane can be used as a paint binder material for the transistor paint.

Conductor paints prepared according to the process of FIG. 4 can include n-type semiconductive materials as the conductive material, e.g., for use as an electron conducting diode paint layer. Examples of n-type semiconductive materials include carbon-based materials, such as graphite powder, activated charcoal, and n-type carbon nanomaterials such as nanoparticles or nanotubes. The n-type semiconductive materials can be doped with an n-type dopant, such as nitrogen, to reduce the work function of the semiconductive material, thus decreasing the forward voltage drop of the diode. For instance, graphite powder having a diameter of 50-800 µm can be used. The mass ratio of graphite can affect the conductivity of the paint layer prepared using the conductor paint. In a specific example, the ratio of graphite powder to acrylic material to water can be 4:1:1.

Conductor paints prepared according to the process of FIG. 4 can include p-type semiconductive materials as the conductive material, e.g., for use as a hole conducting diode paint layer. Examples of p-type semiconductive materials include p-type polymers (e.g., poly(3,4-ethylenedioxythiophene) polystyrene sulfonate (PEDOT:PSS)), hole-conducting nanomaterials (e.g., copper(I) oxide nanoparticles, copper(I) oxide nanoparticles, and nickel(I) oxide nanoparticles). In some examples, a dispersant material, such as benzenesulfonic acid, can be added to the water phase of the conductor paint to facilitate dispersion of the p-type semiconductive material in the water.

Implementations of solar paints can also include ion bridge paint (e.g., for an ion bridge paint layer in a solar battery). Examples of suitable ion bridge material include potassium ions mixed in an ion-conducting material. Examples of suitable ion-conducting materials include polymer electrolytes such as polyethylene oxide (PEO), polyacrylonitrile (PAN), polymethyl methacrylate (PMMA), and polyvinylidene fluoride (PVdF).

Figure 5:
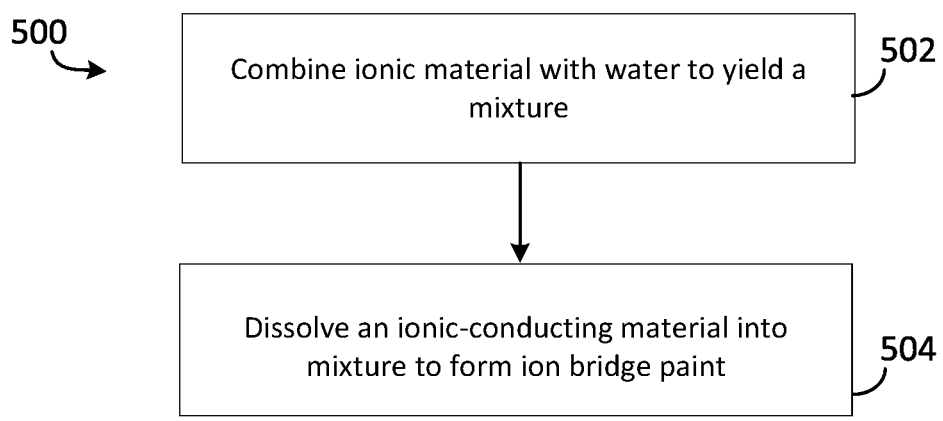
FIG. 5 is a flow chart of another example process for producing ion bridge paint.

FIG. 5 is a flow chart of another example process for producing solar paint. Referring to FIG. 5, ion bridge paint can be prepared by process 500. In 502, a suitable ionic material is combined with water to yield a mixture. In 504, a suitable ion-conducting material is combined with the mixture and agitated gently, avoiding introduction of air bubbles, to yield the ion bridge paint.

Implementations of solar paints can also include electroluminescent or electro-phosphorescent paint (e.g., for phosphorescent paint layers). Examples of suitable electroluminescent material include poly(p-phenylene vinylene), polyflurorene, zinc sulfide doped with copper, gallium arsenide, gallium nitride, rubidium polypyridine, and aluminum gallium indium phosphide. Examples of suitable electro-phosphorescent materials include a polymer host such as poly(N-vinylcarbazole) with an organometallic complex dopant such as Ir(mppy)3, platinum, and other heavy metal complexes.

Figure 6:
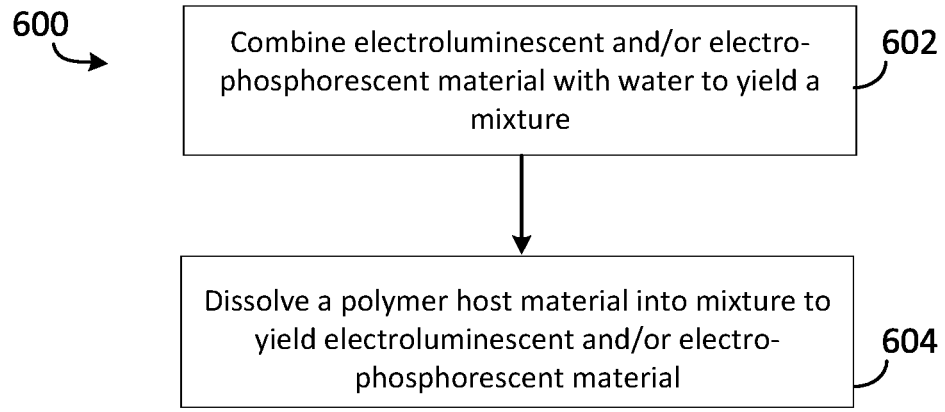
FIG. 6 is a flow chart of another example process for producing electroluminescent and/or phosphorescent paint.

FIG. 6 is a flow chart of another example process for producing solar paint. Referring to FIG. 6, electroluminescent/electro-phosphorescent paint can be prepared by process 600. In 602, a suitable electroluminescent or electro-phosphorescent material is combined with water to yield a mixture. In an optional step 604, a suitable polymer host is combined with the mixture and agitated gently, avoiding introduction of air bubbles, to yield the electroluminescent/electro-phosphorescent paint.

Implementations of solar paints can also include electron (anion) transport paint (e.g., for anode paint layers), photosensitizing paint (e.g., for photosensitized paint layers), and hole (cation) transport paint (e.g., for cathode paint layers). These solar paints include one or more of a fast ion conductor, an electron acceptor, a salt, and a dye.

The fast ion conductor can be an anionic fast ion conductor (e.g., for electron transport paint or photosensitizing paint) or a cationic fast ion conductor (e.g., for hole transport paint). Examples of suitable fast ion conductors include anionic and cationic polyacrylamides, yttria-stabilized zirconia, beta-alumina, lanthanum trifluoride, beta-lead fluoride, silver iodide, copper(I) iodide, rubidium silver iodide, silver mercury iodide, silver sulfide, lead(II) chloride, strontium titanate, strontium stannate, hydrogen uranyl phosphate tetrahydrate, cerium(IV) oxide, zirconium hydrogen phosphate, lithium perchlorate in polyethylene oxide, polyelectrolytes, and ionomers.

An electron acceptor for a particular paint layer can be selected, in part, based on an injection efficiency of the electron acceptor relative to a photosensitizer used in the particular paint layer. Examples of suitable electron acceptors include titanium dioxide (e.g., rutile or anatase titanium dioxide nanoparticles), zinc oxide, benzothiadiazole, benzotriazole, quinoxaline, phthalimide, diketopyrrolopyrrole, thienopyrazine, thiazole, triazine, cyanovinyl, cyano- and fluoro-substituted phenyl, iodine, rhodanine, naphthalamide, and acrylic acids.

Various different dyes can be used to create electronic solar paint. Selection of the dyes used to create electronic solar paint can depend in part on an optimal absorption spectrum for a particular application (e.g., tropical vs. arctic latitude, indoor vs. outdoor use). Additionally, an electronic solar paint can include one or more different dyes for multiple-peak absorption spectra functionality. In some implementations, the dye has high absorption (e.g., in the 500 nm range, which corresponds to a dark bluish-green color), and has at least one chromophore (functional group which is the source of the color/photoactive response) which undergoes excitation from a p to a p* highest-occupied molecular orbital (HOMO) on illumination. Examples of suitable dyes include copper phthalocyanine, zinc phthalocyanine, merocyanine, ruthenium-polypyridine, iron hexacyanoferrate, Ru-polypyridyl-complex sensitizers (e.g., cis-dithiocyanato bis(4,4'-dicarboxy-2,2'-bipyridine)ruthenium (I)).

In an electrolytic cell (meaning an aqueous cell or a cell in which a solid-state electrolyte mediates charge transfer) an electron acceptor can be any oxidizing agent whose reduced state can itself be oxidized by the photosensitizer (i.e. the dye or pigment) in an energetically favorable way, and does not cause or accelerate irreversible chemical degradation of the cell. Salts of lithium, potassium, and iodine can be used. In some implementations, the charge can be mediated entirely by the salt (e.g. reduction from $\Delta I2$ to $2I-$ and oxidation from $2I-$ to $\Delta I2$), and can be galvanically favorable in the absence of water. Examples of suitable salts include potassium iodide.

The electron transport paint is an aqueous composition that includes an anionic fast ion conductor and a salt in a weight ratio of water:salt:anionic fast ion conductor. In some implementations the electron transport paint includes an anionic fast ion conductor and a salt in a weight ratio of water:salt:anionic fast ion conductor of 60:10:1. In some implementations, the electron transport paint is an aqueous composition that includes an anionic fast ion conductor, an electron acceptor, and a salt in a weight ratio of water:electron acceptor:salt:anionic fast ion conductor of 60:10:10:1. A specific mass ratio of salt and/or an electron acceptor in the electron transport paint is based, in part, on a molar mass of the specific salt and/or electron acceptor used in the composition.

In some implementations, the electron transport paint is an aqueous composition that includes an anionic fast ion conductor and a conductive material (e.g., graphite), for example, for a battery anode paint layer.

Figure 7:
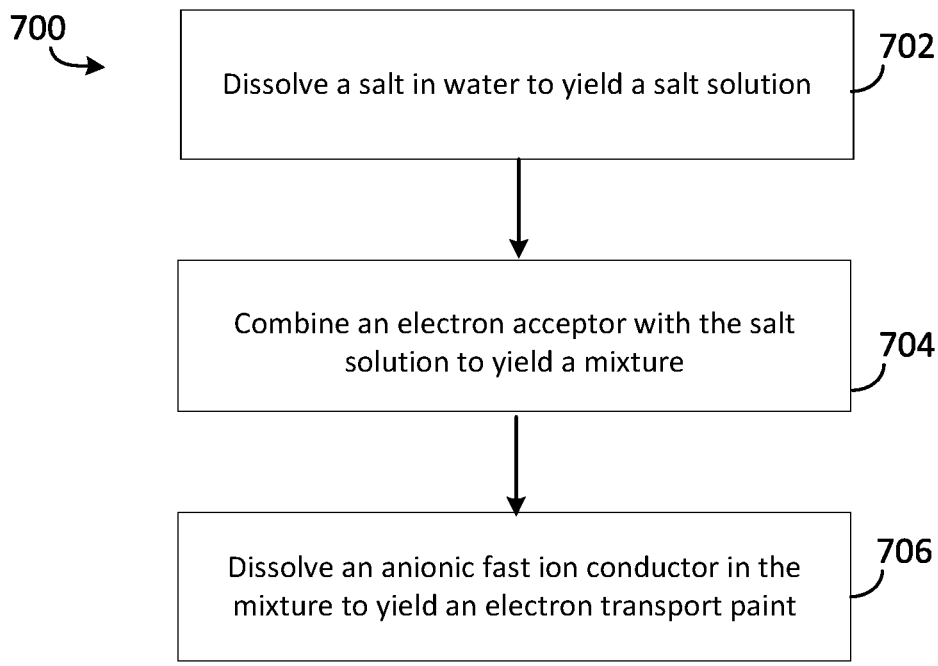
FIG. 7 is a flow chart of another example process for producing electron transport paint.

FIG. 7 is a flow chart of another example process for producing solar paint. Referring to FIG. 7, an electron transport paint can be prepared by process 400. In 702, a suitable salt is dissolved in water to yield a salt solution. In 704, which is optional, a suitable electron acceptor is combined with the salt solution to yield a mixture. The mixture can be agitated (e.g., stirred) to remove clumps. The mixture is allowed to sit, such that the electron acceptor settles to the bottom of the container. After all of the air bubbles have dissipated from the mixture, the anionic fast ion conductor is combined with the mixture in 706 and dissolved to yield electron transport paint. The electron transport paint is in the form of a suspension, with the electron acceptor particles suspended in the paint. In one example, an electron transport paint is an aqueous suspension that includes titanium dioxide, potassium iodide, and anionic polyacrylamide in a weight ratio of water:titanium dioxide:potassium iodide:anionic polyacrylamide of 60:10:10:1. For a small cell (e.g., less than 100 cm$^2$), 1 mL of water is sufficient to cover 8 cm$^2$ of the cell.

The photosensitizing paint is an aqueous composition that includes an anionic fast ion conductor and a dye in a weight ratio of water:anionic fast ion conductor:dye of 6:1:1.

Figure 8:
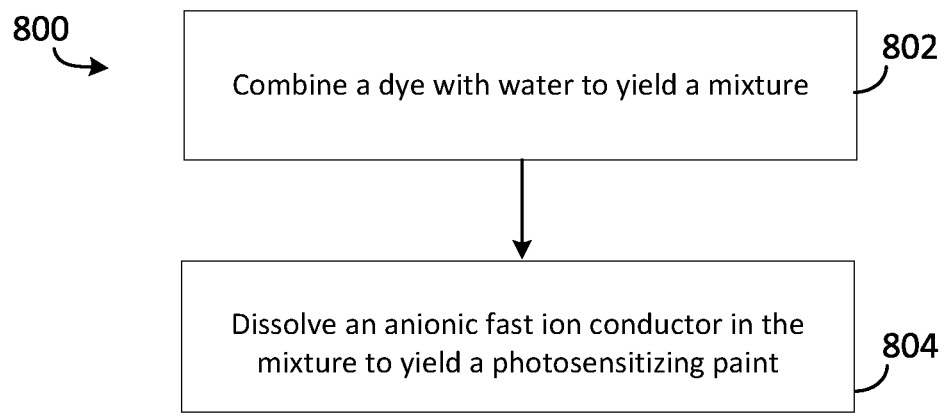
FIG. 8 is a flow chart of another example process for producing photosensitizing paint.

FIG. 8 is a flow chart of another example process for producing solar paint. Referring to FIG. 8, photosensitizing paint can be prepared by process 800. In 802, a suitable dye is combined with water to yield a mixture. In 804, a suitable anionic fast ion conductor is combined with the mixture and agitated gently, avoiding introduction of air bubbles, to yield the photosensitizing paint. The consistency and color of the photosensitizing paint changes as the anionic fast ion conductor dissolves. The photosensitizing paint is in the form of a suspension, with dye suspended in the paint. In one example, a photosensitizing paint is an opaque dark greenish-blue aqueous suspension that includes anionic polyacrylamide and copper phthalocyanine in a weight ratio of water:anionic polyacrylamide:copper phthalocyanine of 6:1:1.

Figure 9:
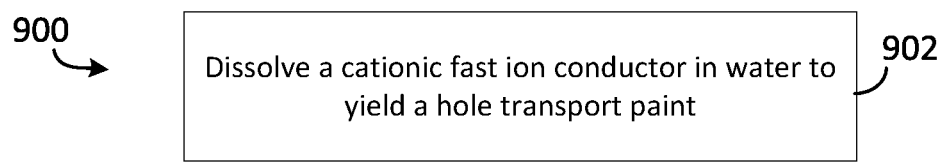
FIG. 9 is a flow chart of another example process for producing hole transport paint.

The hole transport paint is an aqueous composition that includes a cationic fast ion conductor in a weight ratio of water:cationic fast ion conductor of 60:1. FIG. 9 is a flow chart of another example process for producing solar paint. Referring to FIG. 9, hole transport paint can be prepared by process 900. In 902, a suitable cationic fast ion conductor is dissolved in water to yield the hole transport paint. In one example, a hole transport paint is an aqueous composition that includes cationic polyacrylamide in a weight ratio of water:cationic polyacrylamide 60:1.

In some implementations, a hole transport paint formulation can include a cationic fast ion conductor and a dye (e.g., Prussian blue), for example, for a battery cathode paint layer.

In some implementations, a solar paint can be formulate such that a paint layer applied with the solar paint has multiple functionality. For example, a photosensitized/battery cathode paint formulated to apply a photosensitized/battery cathode paint layer, as discussed with reference to FIG. 3, includes one or more of a cationic fast ion conductor and a dye.

Figure 10:
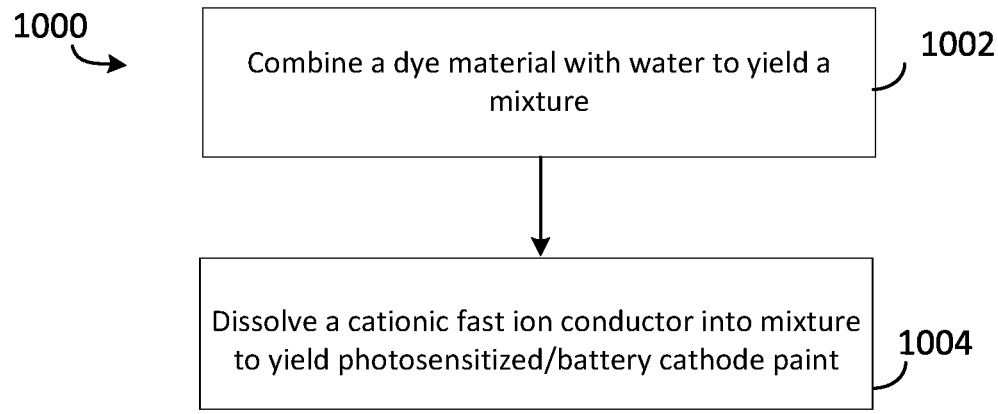
FIG. 10 is a flow chart of another example process for producing photosensitized/battery cathode paint.

FIG. 10 is a flow chart of another example process for producing solar paint. Referring to FIG. 10, photosensitizing/battery cathode paint can be prepared by process 1000. In 1002, a suitable dye is combined with water to yield a mixture. In 1004, a suitable cationic fast ion conductor is combined with the mixture and agitated gently, avoiding introduction of air bubbles, to yield the photosensitizing/battery cathode paint. The consistency and color of the photosensitizing paint changes as the cationic fast ion conductor dissolves. The photosensitizing paint is in the form of a suspension, with dye suspended in the paint. In one example, a photosensitizing paint is an opaque dark greenish-blue aqueous suspension that includes cationic polyacrylamide and copper phthalocyanine in a weight ratio of water:cationic polyacrylamide:copper phthalocyanine of 6:1:1.

Example Process for Producing Solar Paint Circuit

Figure 11:
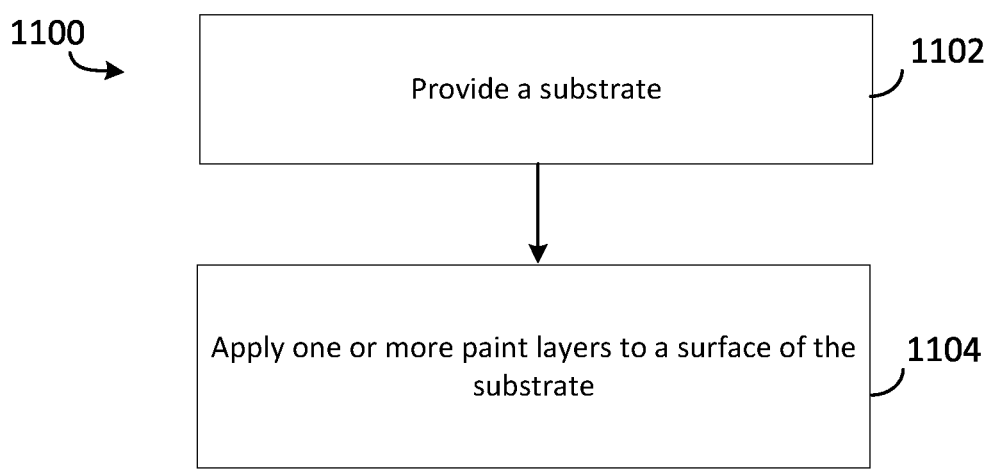
FIG. 11 is a flow chart of an example process for painting a paint circuit.

FIG. 11 is a flow chart of an example process for painting a solar paint circuit. In general, a solar circuit (e.g., solar circuit 100, 150, 200, 300) can be fabricated according to process 1100, as shown in the flow diagram in FIG. 11. In 1102, a substrate is provided. Substrates can include metal, wood, plaster, fabric, or the like. A substrate can further include a wire mesh or foil affixed to a base structural material, to provide electrical conductivity. In 1104, one or more paint layers are applied to a surface of the substrate, where each paint layer includes a conductive paint formulation. In some implementations, each applied paint layer is allowed to dry prior to the application of a subsequent layer.

The conductive paint formulation has a resistance defined, in part, by a concentration of conductive material included in the conductive paint formulation. For example, a lower concentration of the conductive material (e.g., carbon black) included in the conductive paint formulation provides a higher resistance than a conductive paint formulation having a higher concentration of the same conductive material.

In some implementations, multiple coatings of a same conductive paint formulation can be applied to form a layer of a desired thickness, where the desired thickness is greater than a thickness of a single applied layer.

Figure 12:
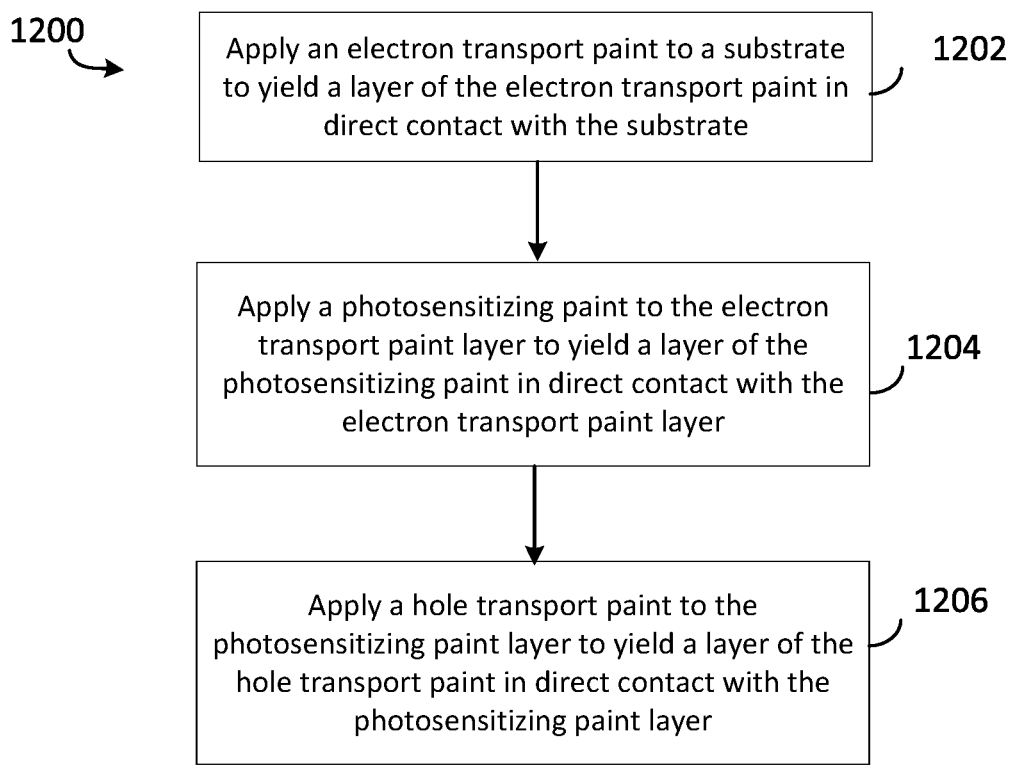
FIG. 12 is a flow chart of another example process for painting a paint circuit.

FIG. 12 is a flow chart of another example process for painting a paint circuit. Referring to FIG. 12, a paint circuit (e.g., solar cell 202, or solar cell 104) can be fabricated according to process 1200. In 1202, electron transport paint is applied to a substrate and allowed to dry to yield a layer of the electron transport paint in direct contact with the substrate. Substrates can be electrically conducting or electrically non-conducting. Suitable electrically insulating substrates include wood, plaster, and plastic. Electrically conducting substrates can include substrates having relatively low work-function, low financial cost, low susceptibility to oxidation, and high physical strength relative to the one or more paint layers. Suitable electrically conducting substrates include aluminum mesh, aluminum foil, as well as zinc, magnesium, nickel, copper, silver, gold, and platinum. In some implementations, one or more additional layers of the electron transport paint can be subsequently applied. In 1204, photosensitizing paint is applied to the to the electron transport paint layer and allowed to dry to yield a layer of the photosensitizing paint in direct contact with the layer of the electron transport paint. In some implementations, one or more additional layers of the photosensitizing paint can be subsequently applied. In 1206, hole transport paint is applied to the photosensitizing paint layer and allowed to dry to yield a layer of the hole transport paint in direct contact with the layer of the photosensitizing paint layer. The hole transport layer is typically transparent. In some implementations, the electron transport layer is transparent in addition to or in place of the hole transport layer being transparent.

Figure 13:
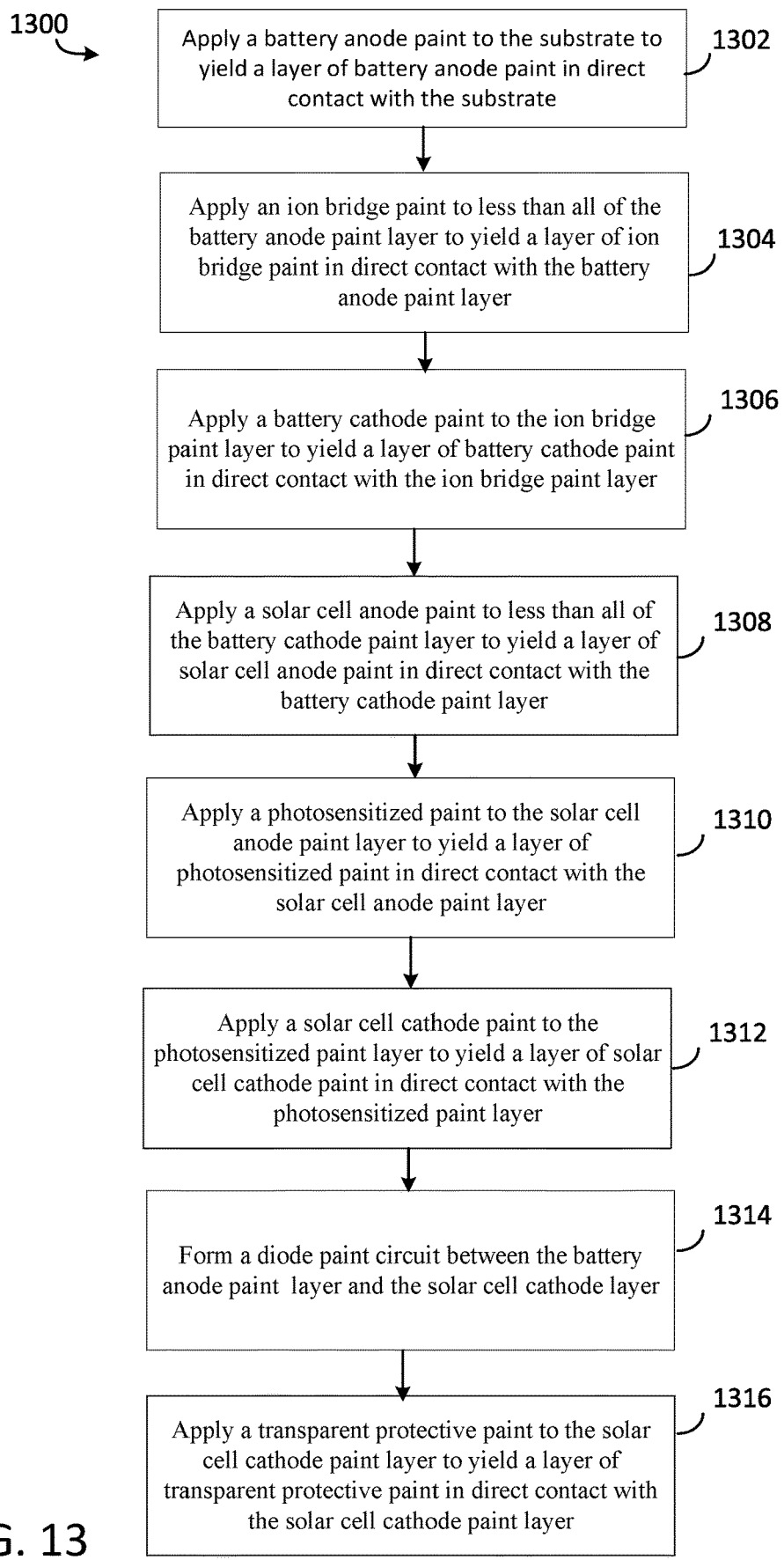
FIG. 13 is a flow chart of another example process for painting a paint circuit.

FIG. 13 is a flow chart 1300 of another example process for painting a paint circuit, for example, solar paint circuit 100 depicted in FIG. 1A. A battery anode paint is applied to the substrate to yield a layer of the battery anode paint in direct contact (e.g., physical and/or electrical) with the substrate (1302). Anion bridge paint is applied to less than all of the battery anode paint layer to yield a layer of ion bridge paint in direct contact with the battery anode paint layer (1304). A battery cathode paint is then applied to the ion bridge paint layer to yield a layer of battery cathode paint in direct contact with the ion bridge paint layer (1306). A solar cell anode paint is applied to less than all of the battery cathode paint layer to yield a layer of solar cell anode paint in direct contact with the battery cathode paint layer (1308). A photosensitized paint is applied to the solar cell anode paint layer to yield a layer of photosensitized paint in direct contact with the solar cell anode paint layer (1310). A solar cell cathode paint is applied to the photosensitized paint layer to yield a layer of solar cell cathode paint in direct contact with the photosensitized paint layer (1312). A diode paint circuit is formed between the battery anode paint layer and the solar cell cathode layer (1314). The diode paint circuit is formed by applying an electron conducting paint to less than all of the battery anode paint layer to yield a layer of electron conducting paint in direct contact with the battery anode paint layer. A hole conducting paint layer is applied to the electron conducting paint layer to yield a layer of hole conducting paint in direct contact with the electron conducting paint layer. The diode paint circuit is formed and physically separated from the photosensitized paint layer, the solar cell anode paint layer, the battery cathode paint layer, and the ion bridge paint layer. A transparent protective paint is applied to the solar cell cathode paint layer to yield a layer of transparent protective paint in direct contact with the solar cell cathode paint layer (1316).

Figure 14:
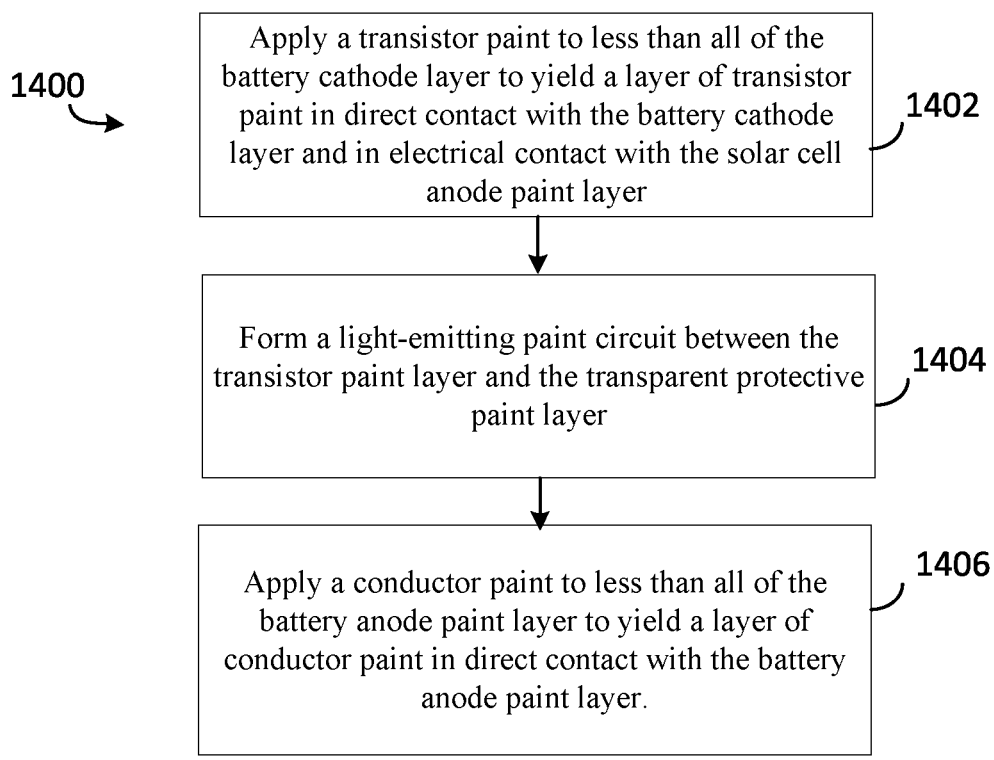
FIG. 14 is a flow chart of another example process for painting a paint circuit.

FIG. 14 is a flow chart 1400 of another example process for painting a paint circuit, for example, solar paint circuit 150 depicted in FIG. 1B. A transistor paint is applied to less than all of the battery cathode layer to yield a layer of transistor paint in direct contact with the battery cathode layer and in electrical contact with the solar cell anode paint layer (1402). A light-emitting circuit is formed between the transistor paint layer and the transparent protective paint layer (1404). Forming the light-emitting circuit includes applying an electron conducting paint (e.g., an anode paint) to less than all of the transistor paint layer to yield a layer of electron conducting paint in direct contact with the transistor paint layer. A phosphorescent paint is applied to the electron conducting paint layer to yield a layer of phosphorescent paint in direct contact with the electron conducting paint layer. A hole conducting paint (e.g., a cathode paint) is applied to the phosphorescent paint layer to yield a layer of hole conducting paint in direct contact with the phosphorescent paint layer. The light-emitting circuit is formed and is physically separated from the photosensitized paint layer. A conductor paint is applied to less than all of the battery anode paint layer to yield a layer of conductor paint in direct contact with the battery anode paint layer and the light-emitting circuit and is physically separated from each of the ion bridge paint layer, the battery cathode paint layer, and the transistor paint layer (1406).

Figure 15:
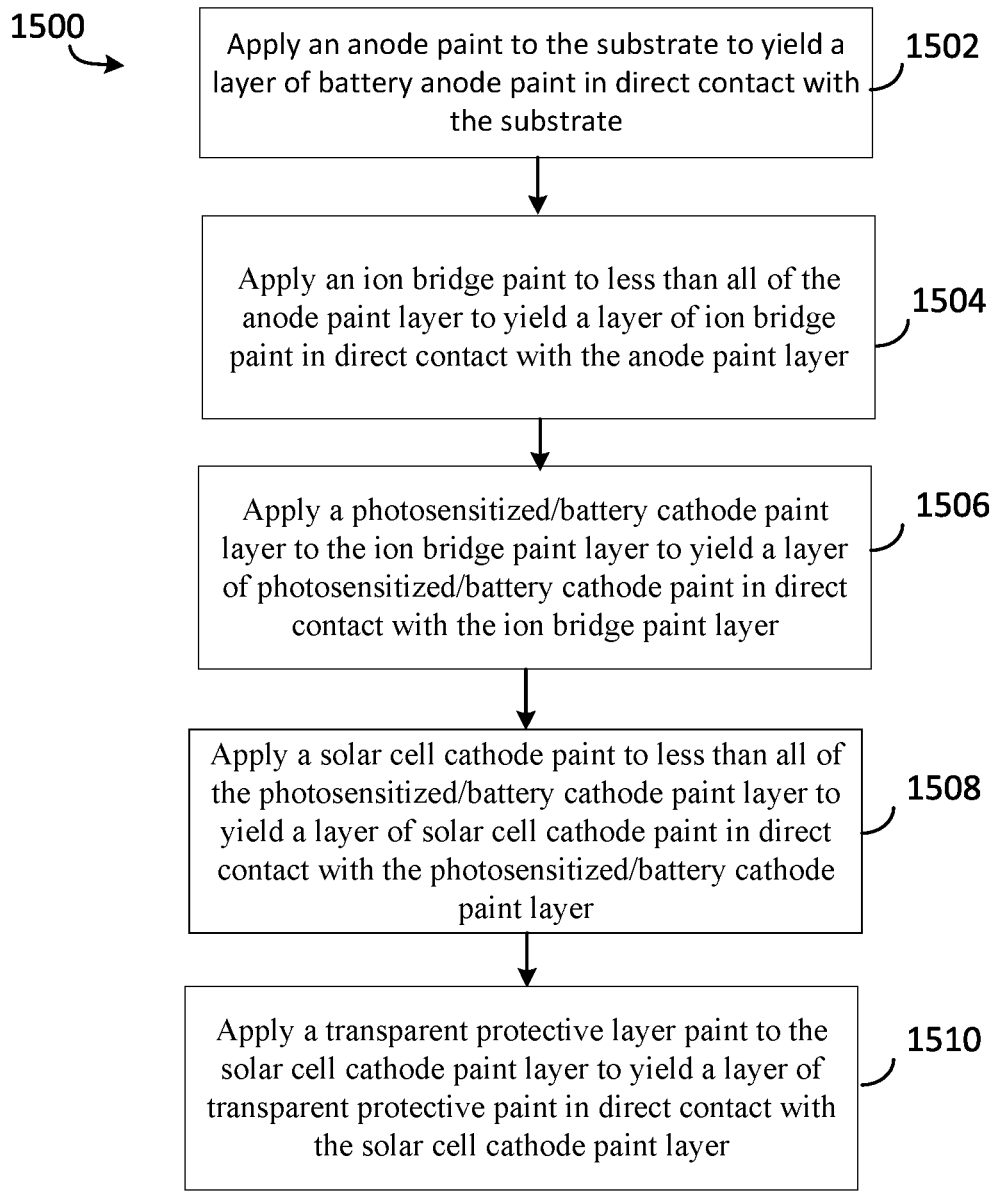
FIG. 15 is a flow chart of another example process for painting a paint circuit.

FIG. 15 is a flow chart 1500 of another example process for painting a paint circuit, for example, solar paint circuit 200 depicted in FIG. 2. An anode paint is applied to the substrate to yield a layer of anode paint in direct contact with the substrate (1502). An ion bridge paint is applied to less than all of the anode paint layer to yield a layer of ion bridge paint in direct contact with the anode paint layer (1504). A photosensitized/battery cathode paint is applied to the ion bridge paint layer to yield a layer of photosensitized/battery cathode paint in direct contact with the ion bridge paint layer (1506). A solar cell cathode paint to less than all of the photosensitized/battery cathode paint layer to yield a layer of solar cell cathode paint in direct contact with the photosensitized/battery cathode paint layer (1508). A transparent protective layer paint is applied to the solar cell cathode paint layer to yield a layer of transparent protective paint in direct contact with the solar cell cathode paint layer (1510).

Figure 16:
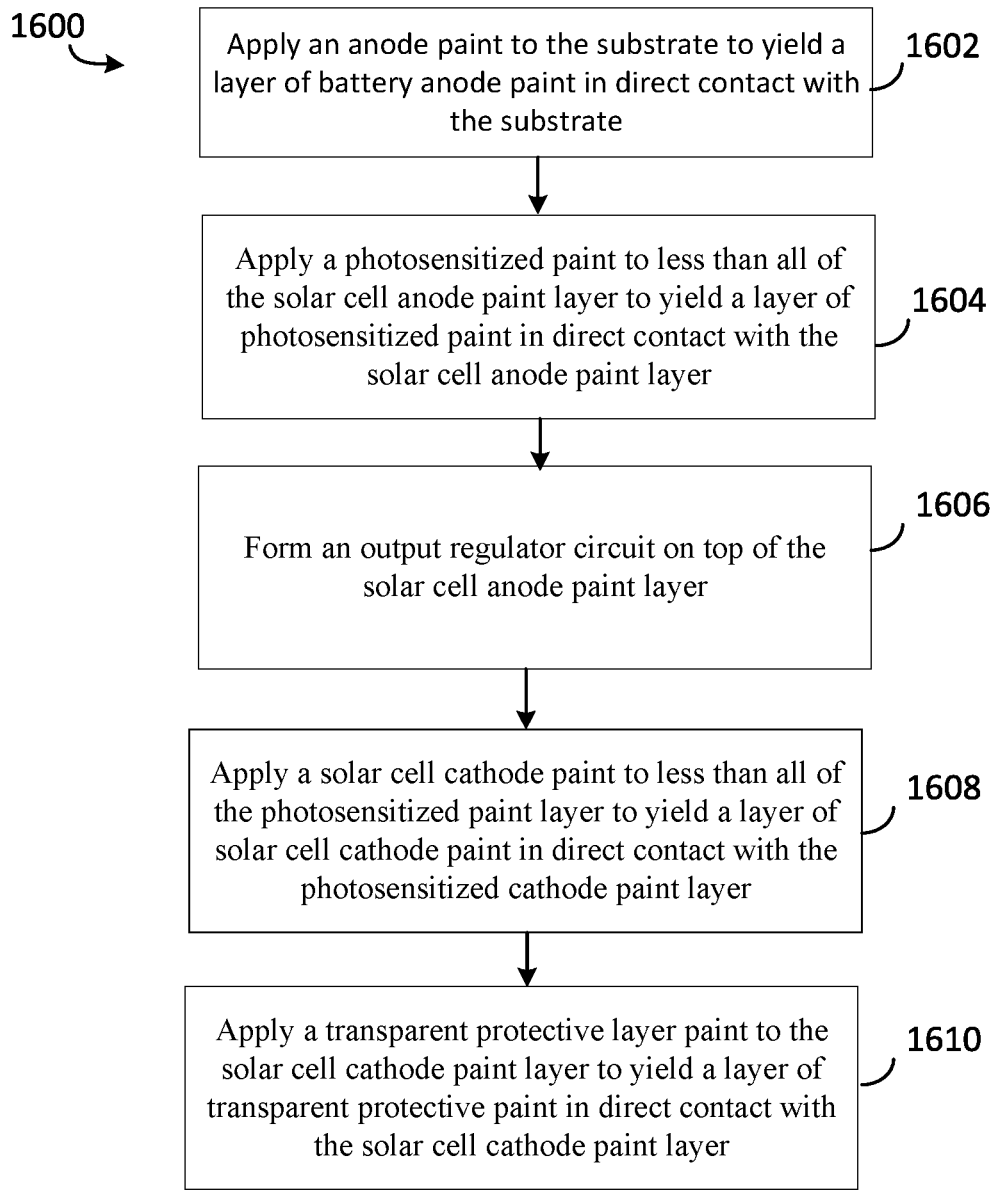
FIG. 16 is a flow chart of another example process for painting a paint circuit.

FIG. 16 is a flow chart 1600 of another example process for painting a paint circuit, for example, solar paint circuit 300 depicted in FIG. 3. An anode paint is applied to the substrate to yield a layer of anode paint in direct contact with the substrate (1602). A photosensitized paint is applied to less than all of the solar cell anode paint layer to yield a layer of photosensitized paint in direct contact with the solar cell anode paint layer (1604). An output regulator circuit is formed on top of the solar cell anode paint layer (1606). The output regulator circuit is formed by a process including applying a resistor paint to less than all of the solar cell anode paint layer to yield a layer of resistor paint in direct contact with the solar cell anode paint layer and adjacent and in electrical contact to the photosensitized paint layer. A transistor paint is applied to the resistor paint layer to yield a layer or transistor paint in direct contact with the resistor paint layer. A solar cell cathode paint is applied to the photosensitized paint layer and the transistor paint layer to yield a layer of solar cell cathode paint in direct contact with the photosensitized paint layer and the transistor paint layer (1608). A transparent protective paint is applied to the solar cell cathode paint layer to yield a layer of transparent protective paint in direct contact with the solar cell cathode paint layer (1610).

In some implementations, a capacitor circuit element can be formed by painting a dielectric paint layer between two conductive paint layers (e.g., a cathode paint layer and an anode paint layer), such that a specific capacitance and breakdown voltage of the capacitor depends, in part, on the dielectric breakdown of the dielectric paint layer and the dielectric paint layer thickness.

In some implementations, perovskite-based solar paint can be used. Perovskites are lead-based, and therefore could be used to create a high-performing solar paint for circumstances in which the use of a lead-based paint may be appropriate.

While this specification contains many specific implementation details, these should not be construed as limitations on the scope of any features or of what can be claimed, but rather as descriptions of features specific to particular embodiments of the described painted circuits and painted circuit elements. Though the painted circuits and painted circuit elements examples are described herein as having particular layer structures, they should not be read as limiting. For example, the painted circuits and painted circuit elements are described as operating in a "top-down" fashion where the devices are painted layer-by-layer such that the top layer is the top of the device. While processes are depicted in the drawings in a particular order, this should not be understood as requiring that such processes be performed in the particular order shown or in sequential order, or that all illustrated processes be performed, to achieve desirable results. For example, the painted circuits and painted circuit elements may also be painted in a "bottom-up" fashion where the function of the devices is upside relative to their fabrication order. Additionally, "flip-chip" configurations can be imagined where two substrates are individually painted with paint layers and then combined.

Other complex painted circuit elements can be created using the techniques and compositions described herein. For example, painted antenna elements. Additionally, active matrices of multiple smaller sub-elements (e.g., embedded painted circuit elements) can be created using the techniques and compositions described herein.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A painted circuit, comprising:
a substrate; and
one or more paint layers applied to the substrate, the one or more paint layers each forming an electrical component of the painted circuit, wherein:
a given paint layer of the one or more paint layers comprises a conductive paint formulation having a resistance that is defined by a concentration of conductive material that is included in the conductive paint formulation and a thickness of the given paint layer; and
lower concentrations of the conductive material included in the conductive paint formulation provide a higher resistance than higher concentrations of conductive material; and
wherein the one or more paint layers of conductive paint comprise:
a battery anode paint layer applied to the substrate;
an ion bridge paint layer applied to less than all of the battery anode paint layer; and
a battery cathode paint layer applied to the ion bridge paint layer;
a solar cell anode paint layer applied to less than all of the battery cathode paint layer;
a photosensitized paint layer applied to the solar cell anode paint layer; and
a solar cell cathode paint layer applied to the photosensitized paint layer.

2. The painted circuit of claim 1, wherein the one or more paint layers of conductive paint further comprise:
a diode paint circuit that is formed between the battery anode paint layer and the solar cell cathode paint layer.

3. The painted circuit of claim 2, wherein the diode paint circuit is physically separated from each of the photosensitized paint layer, the solar cell anode paint layer, the battery cathode paint layer, and the ion bridge paint layer.

4. The painted circuit of claim 3, wherein the diode paint circuit includes an electron conducting paint layer and a hole conducting paint layer.

5. The painted circuit of claim 1, further comprising a transparent protective layer applied to the solar cell cathode paint layer.

6. The painted circuit of claim 4, in which the electron conducting paint layer comprises a n-type semiconductor.

7. The painted circuit of claim 4, in which the hole conducting paint layer comprises a p-type semiconductor.

8. The painted circuit of claim 7, in which the p-type semiconductor comprises p-type nanoparticles.

9. The painted circuit of claim 5, further comprising:
a transistor paint layer applied to less than all of the battery cathode paint layer and in electrical contact with the solar cell anode paint layer;
a light-emitting circuit that is formed between the transistor paint layer and the transparent protective layer.

10. The painted circuit of claim 9, wherein the light-emitting circuit is physically separated from the photosensitized paint layer.

11. The painted circuit of claim 9, wherein the light-emitting circuit includes an electron conducting paint layer, a hole conducting paint layer, and a phosphorescent paint layer between the electron conducting paint layer and the hole conducting paint layer.

12. The painted circuit of claim 9, further comprising a conductor paint layer that is formed between the battery anode paint layer and the light-emitting circuit, wherein the conductor paint layer is physically separated from each of the ion bridge paint layer, the battery cathode paint layer, and the transistor paint layer.

13. The painted circuit of claim 9, wherein the transistor paint layer comprises a composition including a dielectric material that has a breakdown voltage that corresponds to a switching voltage of the transistor paint layer.

14. A painted circuit, comprising:
a substrate; and
one or more paint layers applied to the substrate, the one or more paint layers each forming an electrical component of the painted circuit, wherein:
a given paint layer of the one or more paint layers comprises a conductive paint formulation having a resistance that is defined by a concentration of conductive material that is included in the conductive paint formulation and a thickness of the given paint layer; and
lower concentrations of the conductive material included in the conductive paint formulation provide a higher resistance than higher concentrations of conductive material; and
wherein the one or more paint layers of conductive paint comprise:
an anode paint layer applied to the substrate;
a further ion bridge paint layer applied to less than all of the anode paint layer;
a photosensitized/battery cathode paint layer applied to the further ion bridge paint layer;
a further solar cell cathode paint layer applied to less than all of the photosensitized/battery cathode paint layer; and
a transparent protective layer applied to the further solar cell cathode paint layer.

15. The painted circuit of claim 14, wherein the anode paint layer comprises an aqueous composition including:
an anionic fast ion conductor; and
a salt in a weight ratio of water, wherein the salt in the weight ratio of water:salt:anionic fast ion conductor is 60:10:1.

16. The painted circuit of claim 14, wherein the further ion bridge paint layer comprises an aqueous composition including an ionic material and an ion-conducting polymer in a weight ratio of water.

17. The painted circuit of claim 14, further comprising two or more contacts, each contact comprising a metallic foil affixed to an anode paint layer or a photosensitized/battery cathode paint layer and in electrical contact with the anode paint layer or the photosensitized/battery cathode paint layer, respectively.

18. A painted circuit, comprising:
a substrate; and
one or more paint layers applied to the substrate, the one or more paint layers each forming an electrical component of the painted circuit, wherein:
a given paint layer of the one or more paint layers comprises a conductive paint formulation having a resistance that is defined by a concentration of conductive material that is included in the conductive paint formulation and a thickness of the given paint layer; and
lower concentrations of the conductive material included in the conductive paint formulation provide a higher resistance than higher concentrations of conductive material; and
wherein the one or more paint layers of conductive paint comprise:
a further solar cell anode paint layer applied to the substrate;
a further photosensitized paint layer applied to less than all of the further solar cell anode paint layer;
an output regulator circuit that is formed on top of the further solar cell anode paint layer, the output regulator circuit comprising a resistor paint layer and transistor paint layer, wherein:
the resistor paint layer is applied to the further solar cell anode paint layer and is applied adjacent to the further photosensitized layer; and
the transistor paint layer is applied to the resistor paint layer;
a yet further solar cell cathode paint layer applied to the further photosensitized paint layer and the transistor paint layer; and
a transparent protective paint layer applied to the yet further solar cell cathode paint layer.

19. The painted circuit of claim 18, wherein the transistor paint layer comprises a composition including a dielectric material that has a breakdown voltage that corresponds to a switching voltage of the transistor paint layer.

20. The painted circuit of claim 18, further comprising two or more contacts, each contact comprising a metallic foil affixed to a solar further cell anode paint layer or a yet further solar cell cathode paint layer and in electrical contact with the further solar cell anode paint layer or the yet further solar cell cathode paint layer, respectively.

* * * * *